(12) United States Patent
Hatae

(10) Patent No.: US 6,433,584 B1
(45) Date of Patent: Aug. 13, 2002

(54) SEMICONDUCTOR INTEGRATED CIRCUIT

(75) Inventor: Hiroshi Hatae, Saitama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/700,925

(22) PCT Filed: Jun. 18, 1998

(86) PCT No.: PCT/JP98/02685

§ 371 (c)(1),
(2), (4) Date: Nov. 21, 2000

(87) PCT Pub. No.: WO99/66640

PCT Pub. Date: Dec. 23, 1999

(51) Int. Cl.[7] .......................................... H03K 19/175
(52) U.S. Cl. .............................. 326/80; 326/38; 326/40; 326/46; 326/80; 326/81; 326/93; 326/95; 326/96; 326/98; 327/544
(58) Field of Search ........................... 327/544; 326/38, 326/40, 46, 80, 81, 93, 96, 95, 98

(56) References Cited

U.S. PATENT DOCUMENTS

| | | | | |
|---|---|---|---|---|
| 5,486,774 A | * | 1/1996 | Douseki et al. | 326/33 |
| 5,614,847 A | * | 3/1997 | Kawahara et al. | 326/98 |
| 5,652,536 A | * | 7/1997 | Nookala et al. | 327/298 |
| 6,023,179 A | * | 2/2000 | Klass | 327/211 |
| 6,078,193 A | * | 6/2000 | Bazuin et al. | 326/93 |
| 6,239,614 B1 | * | 5/2001 | Morikawa | 326/39 |

FOREIGN PATENT DOCUMENTS

| | | |
|---|---|---|
| JP | 59-224914 | 12/1984 |
| JP | 59-224915 | 12/1984 |
| JP | 60-7224 | 1/1985 |
| JP | 5-108194 | 4/1993 |
| JP | 5-291929 | 11/1993 |
| JP | 6-29834 | 2/1994 |
| JP | 6-112810 | 4/1994 |
| JP | 7-212217 | 8/1995 |
| JP | 8-228145 | 9/1996 |
| JP | 8-321763 | 12/1996 |

OTHER PUBLICATIONS

Matsutani et al., "1 V Low Power Supply High–Speed Digital Circuit Technology with MTCMOS" (LSI Laboratory, NTT).

* cited by examiner

*Primary Examiner*—Michael Tokar
*Assistant Examiner*—Khai Nguyen

(57) ABSTRACT

The present invention includes a logic circuit block operated in synchronism with a clock signal, power supply switches which supply power to the logic circuit block, and a switch control circuit which controls the power supply switches. The switch control circuit switch-controls the power supply switches so as to bring a period shorter than the cycle of the clock signal to an on operation period in synchronism with a clock signal. When the logic circuit block is supposed to be activated in synchronism with a clock signal having a frequency lower than a clock signal frequency for defining the maximum operation speed of the logic circuit block, the logic circuit block does not develop a malfunction theoretically if capable of operation for each cycle of the clock signal at least only for a time interval defined by the clock signal frequency of the maximum operation speed. Since the supplying of operating power to the logic circuit block is cut off according to the clock signal frequency except for a period necessary for a circuit operation, leak current that will flow through each turned-off transistor in the meantime, can be significantly reduced.

24 Claims, 18 Drawing Sheets

FIG. 18

| | HIGH-SPEED OPERATION MODE | LOW-SPEED OPERATION MODE | STANDBY | POWER OFF |
|---|---|---|---|---|
| CLOCK FREQUENCY | HIGH SPEED | LOW SPEED | STOP | |
| CONTROL ON POWER CUTTING-OFF MOS | ALWAYS ON | INTERMITTENTLY ON | INTERMITTENTLY ON | NIL |
| DYNAMIC CURRENT CONSUMPTION | LARGE AND SMALL | NIL | NIL | NIL |
| STATIC CURRENT CONSUMPTION | LARGE, SMALL AND SMALL | NIL | | |
| STATE OF PORTABLE TERMINAL | DURING CALL DURING PROGRAM EXECUTION | ON STANDBY | ON SUSPEND | ON POWER-OFF |

SEMICONDUCTOR INTEGRATED CIRCUIT

TECHNICAL FIELD

The present invention relates to a semiconductor integrated circuit, and particularly to a technology for electrically cutting off a logic circuit unit from operating power supplies therefor upon standby and reducing a leak current developed upon standby. The present invention relates to a technology effective for application to, for example, a battery-driven cellular phone or PAD (Personal Digital Assistant) or the like.

BACKGROUND ART

With technical advances in semiconductor integrated circuit and the wide range of its application field, a reduction in power consumption of the semiconductor integrated circuit (semiconductor chip) has become important in recent years. Namely, the reduction in power consumption of the semiconductor integrated circuit has come to be an important consideration in battery-driven applications such as a PDA, etc., in maximizing operating time. Reducing the power-supply or source voltage is most effective for the reduction in power consumption. However, as side effects may be mentioned, a reduction in current supply capability of each transistor, and a reduction in working speed of the transistor can result. In order to overcome such a problem, there is known a method of reducing Vth (threshold voltage) of the transistor. However, the mere reduction in threshold voltage will increase the leak current developed when the transistor is held in an off state. In doing so, needless current consumption will increase even when the semiconductor integrated circuit is brought to a standby state. The standby state is a so-called one low power consumption mode capable of stopping the supply of a clock signal for synchronous operation, for example and achieving its state. A technology that has been proposed to overcome such a problem is the MT-CMOS (Multi-Threshold CMOS). The present technology has been described in, for example, "Electronic Technology" issued by THE NIKKAN GOGYO SHINBUN, LTD., p.29–32, September 1994.

The MT-CMOS technology utilizes transistors (high threshold voltage transistors) each having a large threshold voltage ranging from about 0.5V to about 0.7V and transistors (low threshold transistors) each having a small threshold voltage ranging from about 0.2V to about 0.3V when an operating power supply is about 1V, for example. Low threshold voltage transistors are used for logic gates constituting a logic circuit group. Operating power supplies for the respective logic gates are supplied from source or power-supply terminals through MOS transistors for power supply, which comprise the high threshold voltage transistors. When the MOS transistors are turned on to supply the operating power supplies to each individual logic gate, the low threshold voltage MOS transistors constituting the logic gates can be operated at high speed because of their low threshold voltages. When the MOS transistors are turned off upon standby, a leak current that will flow through a turnedoff transistor of each logic gate, can be cut off because of the high threshold voltage of each MOS transistor for power supply.

It has been revealed by the present inventors that in the MT-CMOS technology, the leak current developed upon standby can be reduced, whereas the leak current developed upon operation cannot be reduced in spite of the operating clock frequency.

Namely, most personal digital assistants respectively have an operation mode between a high-speed operation mode high at the clock signal frequency and a standby mode for stopping a clock signal, i.e., a low-speed operation mode operated at a low-speed clock signal frequency. During a waiting operation of a cellular phone, for example, call detection and an outgoing or dialing operation for notifying the present position may be carried out at predetermined intervals, and less throughput is provided as compared with signal processing or the like made while a call is in progress. Thus, such a waiting process will be enough if the phone is operated in synchronism with a low-speed clock signal.

A circuit operated in synchronism with the clock signal performs a logic operation for each clock signal cycle and carries out the operation of latching the result thereof in a signal transmission system. If the clock signal becomes slow, then the logic operation is determined by some of the clock cycle, and the circuit is kept at a constant state during the remaining period. At this time, each turned-off transistor continues to have a flow of leak current if the threshold voltage thereof is small. The MT-CMOS technology is accompanied by a problem that since the high threshold voltage MOS transistors for supplying power remain at the on state except for during the standby state, the leak current relatively increased when the frequency of the operating clock signal for each logic gate is low, cannot be reduced.

An object of the present invention is to reduce the leak current developed when a transistor is held in an off state.

Another object of the present invention is to provide a data processor with a semiconductor integrated circuit capable of reducing the leak current developed in a turned-off transistor when the frequency of the operating clock signal is low, in other words, when a logic circuit block is operated at low speed.

A further object of the present invention is to provide a data processor with a semiconductor integrated circuit wherein operating power supplies are supplied to within each of the logic circuit blocks through a switch transistor whose threshold voltage is rendered high as compared with each transistor lying in the logic circuit block, and a leak current flowing through each turned-off transistor lying within the logic circuit block can be reduced.

The above and other objects, and novel features of the present invention will become apparent from the following description of the present specification and the accompanying drawings.

DISCLOSURE OF THE INVENTION

The present invention includes a logic circuit block operated in synchronism with a clock signal, at least one power supply switch which supplies power to the logic circuit block, and a switch control circuit which controls the power supply switch. The switch control circuit switch-controls the power supply switch so as to bring a period shorter than the cycle of the clock signal to the on operation period in synchronism with the clock signal. As an example, using the above, the logic circuit block is activated in synchronism with a first operating clock signal having a frequency lower than that of a second operating clock signal for defining the maximum operation speed of the logic circuit block. At this time, the logic circuit block does not develop a malfunction in the logic operation itself theoretically if capable of operation for each cycle of the first operating clock signal at least only for a predetermined time defined by the frequency of the second operating clock signal, for example, a one-cycle period. This is because the logic block is designed so as to operate based on the second operating clock signal. Thus, since the supply of operating power to the logic circuit block is cut off except for a period necessary for a circuit operation, a leak current that will flow through each turned-off transistor in the logic circuit block in the meantime, can be significantly reduced.

If consideration is given to points about a high-speed operation of the logic circuit block with respect to reductions in the operating power supplies and a reduction in leak current at standby in a manner similar to the MT-CMOS technology at this time, then threshold voltages of transistors constituting the logic circuit block can be rendered relatively small to allow the high-speed operation upon a low-voltage operation. Further, the threshold voltage of a current supply switch can be rendered relatively large to reduce the leak current at standby.

When the above means of the present invention is compared with the MT-CMOS technology, the present invention can reduce the leak current developed when the transistors of the logic circuit block are turned off upon low-speed operation synchronized with a low-frequency clock signal which does not allow for the MT-CMOS technology. However, the logic circuit block is not limited to a CMOS circuit in the present invention. Further, the operating power supply is not limited to a low voltage like 1V. Furthermore, the threshold voltages of the power supply switch and the transistors constituting the logic circuit block are not limited to the above relation. Imposing such a limitation on the present invention is most suitable in terms of low power consumption of a low-voltage operated semiconductor integrated circuit intended or planned for high-speed operation.

Further, the above means of the present invention is compared with VT-CMOS (Variable Threshold-CMOS) technology. The VT-CMOS technology aims to change a substrate bias voltage to thereby control the threshold voltage of each MOS transistor. A substrate bias voltage of a logic circuit block is controlled to increase the threshold voltage upon standby operation, for example. Thus, the leak current flowing through each MOS transistor turned off upon standby can be reduced. In the VT-CMOS technology, relatively large capacitive components parasitic on a substrate or well shared between many MOS transistors must be charged or discharged, and a relatively long time interval is required to change the threshold voltage. Namely, it is not possible to change the potential applied to the substrate or well at high speed. Thus, even when the logic circuit block is activated in synchronism with a low-frequency clock signal, it is difficult to perform switching to the substrate bias voltage for each clock signal cycle. Further, an improvement in drive capability of an output transistor of a voltage generating circuit, which performs a change in substrate or well potential, and the provision of plural voltage generating circuits are also considered to allow the change in potential applied to the substrate or well. Since, however, an occupied area is required in terms of layout, this is not considered to be realistic.

Setting means for programmably setting the on operation period of the power supply switch is provided. The switch control circuit can be configured so as to determine the on operation period, based on a set value supplied from the setting means. Thus, the reduction in leak current can be controlled to the maximum according to the clock signal frequency to be used.

Control on the on operation period for the power supply switch can be carried out only when a specific operation mode like a first operation mode is established. The power supply switch can always be turned on in another operation mode like a second operation mode. Further, the semiconductor integrated circuit may not have another operation mode like the second operation mode.

The first and second operation modes can be defined as operation modes for determining the frequency of a clock signal. A clock control circuit is provided which is supplied with, for example, a first clock signal and a second clock signal higher than the first clock signal in frequency. The clock control circuit supplies the first clock signal to the logic circuit block when the first operation mode is specified, and supplies the second clock signal to the logic circuit block when the second operation mode is specified. Thus, when the first operation mode in which the logic circuit block is activated at low speed, is designated, the leak current flowing through each transistor can be reduced within the logic circuit block as described above.

The logic circuit block can be configured inclusive of at least one combinational circuit and at least one sequence circuit activated in synchronism with a clock signal. The size of a logic scale thereof is out of the question. The sequence circuit is configured as a flip-flop or a latch circuit or the like.

When, for example, the sequence circuit is operated so as to capture and hold data supplied to a data input terminal of the sequence circuit in synchronism with a first edge of a clock signal supplied to a clock terminal of the sequence circuit, the switch control circuit can be configured inclusive of detecting means which detects the first edge of the first clock signal, a counter which counts the second clock signal and is reset based on a detected signal of the first edge, a comparator which detects a coincidence between a count of the counter and the set value, and a signal generating circuit which generates a signal for determining the on operation period of the power supply switch, based on the first edge of the first clock signal and the coincident detection obtained by the comparator.

When consideration is given to the case in which the semiconductor integrated circuit supports a standby mode defined as a low power consumption mode, the clock control circuit can be configured so as to stop the supply of a clock signal to the logic circuit block when a third operation mode is specified. The power supply switch may always be kept in an off state in response to this third mode. Alternatively, the switch control circuit may bring the power supply switch to an on operation for each predetermined period in response to the designation of the third mode to refresh each internal node of the logic circuit block. If no refresh operation is taken, then an electrical charge at the node leaks to a substrate or the like and is gradually reduced in a state in which the supply of the electrical charge through the power supply switch is completely cut off. The refresh operation aims to make u p for such a reduction.

The power supply switch can be defined as either a first switch connected to a power-supply or source terminal on the high-potential side or a second switch connected to a power-supply or source terminal on the low-potential side, or both switches. When both are defined as objects to be controlled, the time required to return the power from its cut-off state to its supply state can be shortened.

A data processing system or equipment of the present invention according to another aspect includes a plurality of logic circuit blocks operated in synchronism with a clock signal supplied thereto, a clock control circuit which controls the supply of the clock signal to the plurality of logic circuit blocks, at least one power supply switch which controls the supply of a power supply or source to the plurality of logic circuit blocks, and a switch control circuit which controls the turning on and off of the power supply switch. The clock control circuit supplies a first clock signal to the plurality of logic circuit blocks in response to the designation of a lowspeed mode, supplies a second clock signal higher than the first clock signal in frequency to the plurality of logic circuit blocks in response to the designation of a high-speed mode, and stops the supply of the clock signal to a predetermined logic circuit block in the plurality of logic blocks in response to the designation of a standby mode. Further, the switch control circuit switchcontrols the power supply switch in response to the designation of the low-speed mode so as to bring a period shorter than the cycle of the first clock signal to an on operation period in synchronism with the first clock signal, bring the power supply switch to a continuous on state in response to the designation of the high-speed mode, and bring the power supply switch of the predetermined logic block to a continuous off state in response to the designation of the standby mode.

A data processing system or equipment of the present invention according to a further aspect includes a plurality of logic circuit blocks operated in synchronism with a clock signal supplied thereto, a clock control circuit which controls the supply of the clock signal to the plurality of logic circuit blocks, at least one power supply switch which controls the supply of a power supply to the plurality of logic circuit blocks, and a switch control circuit which controls the turning on and off of the power supply switch. The clock control circuit supplies a first clock signal to the plurality of logic circuit blocks in response to the designation of a low-speed mode, supplies a second clock signal higher than the first clock signal in frequency to the plurality of logic circuit blocks in response to the designation of a high-speed mode, and stops the supply of the clock signal to a predetermined logic circuit block of the plurality of logic blocks in response to the designation of a standby mode. The switch control circuit switch-controls the power supply switch in response to the designation of the low-speed mode so as to bring a period shorter than the cycle of the first clock signal to an on operation period in synchronism with the first clock signal, bring the power supply switch to a continuous on state in response to the designation of the high-speed mode, and turn on the power supply switch for each predetermined period in response to the designation of the standby mode, thereby refreshing internal nodes in the logic circuit blocks.

The plurality of logic circuit blocks can be defined as a CPU subjected to clock control and powersupply control responsive to the high-speed, low-speed and standby modes, an interrupt control circuit subjected to the clock control and power-supply control responsive to the high-speed and the low-speed, etc. The data processing system including those logic circuit blocks can constitute a multi-chip or single-chip processor.

The power control circuit can resume the supplying of power to the logic circuit blocks in response to a standby mode reset signal, and the clock control circuit can resume the supplying of a clock signal to the logic circuit blocks in response to the standby mode reset signal.

Display means, input means and communication means placed under the control of the processor can further be provided to constitute a data processing system such as for a PDA. In the data processing system, the processor is capable of performing signal processing and protocol processing at high speed in a communication state made by the communication means, for example. In a waiting state of the communication means, an incoming-call decision, etc. may be performed at low speed. Upon such a low-speed operation, the leak current can be reduced and the battery operating time can be extended.

BRIEF DESCRIPTION OF THE DRAWINGS

FIG. 18 is an explanatory view showing states of power consumption every operation modes of a processor chip.

BEST MODE FOR CARRYING OUT THE INVENTION

Figure 1:
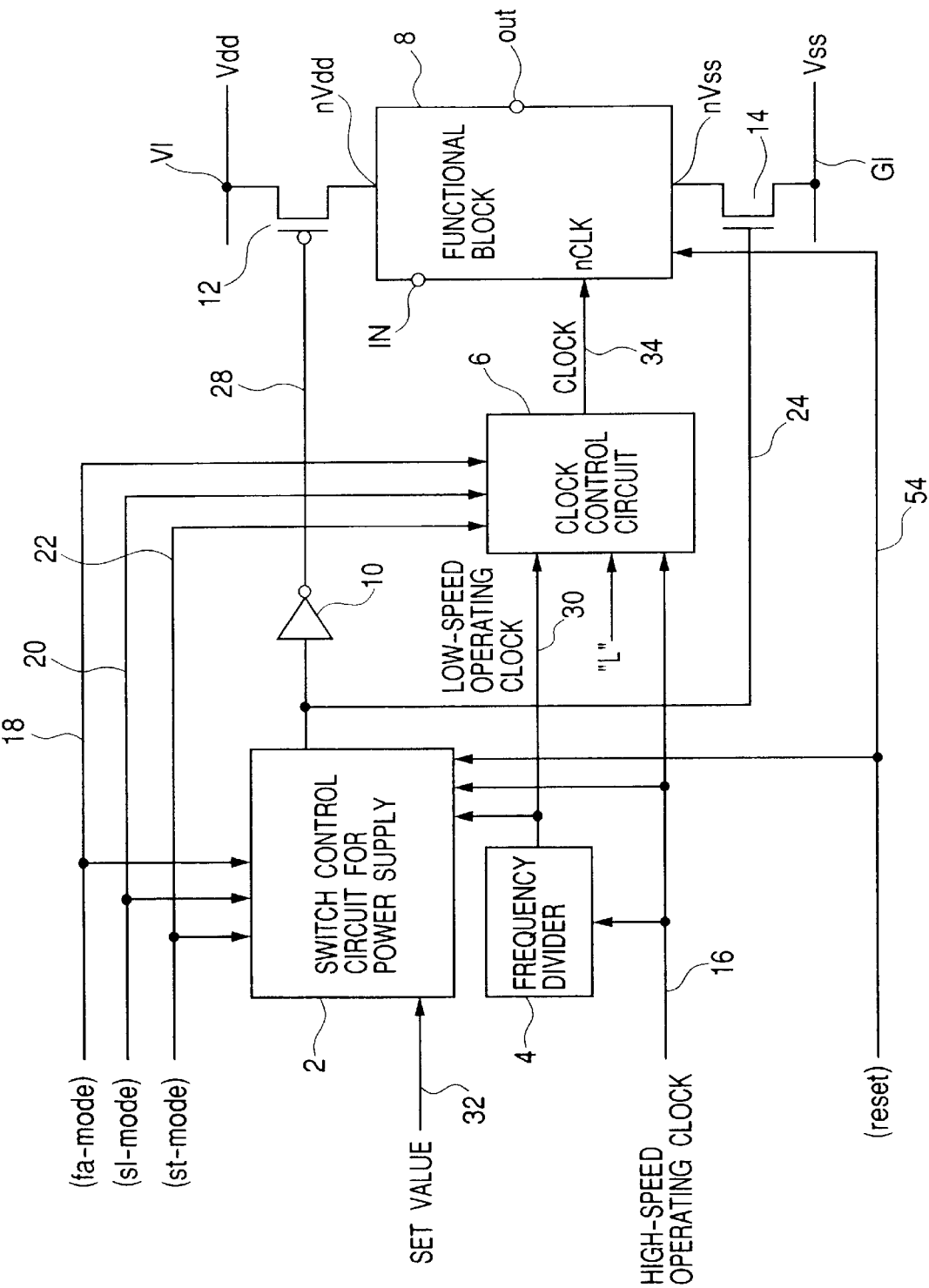
FIG. 1 is a block diagram showing a first embodiment of a semiconductor integrated circuit according to the present invention.

A first embodiment of a semiconductor integrated circuit according to the present invention is shown in FIG. 1. A configuration shown in FIG. 1 is formed on a single semiconductor substrate like monocrystal silicon together with unillustrated other necessary configurations by CMOS integrated circuit manufacturing technology, for example.

In the first embodiment, one functional block 8 is typically illustrated as a logic circuit block comprised of an arbitrary logic circuit. Operating power supplies for the functional block 8 include a high-potential side power supply Vdd defined as a first power-supply voltage like 1V, for example, and a low-potential side power supply Vss defined as a second power-supply voltage like a circuit's ground voltage (OV). The high-potential side power supply Vdd is supplied from a power-supply wiring V1 to a first power supply node nVdd of the functional block 8 through a power supply MOS transistor 12. The low-potential side power supply Vss is supplied from a ground wiring G1 to a second power supply node nVss of the functional block 8 through a power supply MOS transistor 14. The functional block 8 includes a clock input node nCLK supplied with an operating clock, a data input node IN to which data is inputted, and a data output node out from which data is outputted. Incidentally, although not shown in the drawing, respective circuits described in the drawing are respectively regarded as being supplied with the power supplies Vdd and Vss through the wirings V1 and G1.

Designated at numeral 2 in FIG. 1 is a switch control circuit for the control of the power supply, for generating drive signals 24 and 28 used for the power supply MOS transistors 12 and 14. Designated at numeral 4 is a frequency divider for dividing a clock signal (first clock signal) for low-speed operation 30 from or based on a clock signal (second clock signal) for high-speed operation 16, and designated at numeral 6 is a clock control circuit for controlling a clock signal supplied to the functional block 8 according to mode signals 18 (fa-mode), 20 (sl-mode) and 22 (st-mode), respectively. When one signal of the mode signals 18, 20 and 22 is selectively changed from a low level (or inactive level) to a high level (or active level), one mode is selected and specified. Namely, the high level of the mode signal 18 indicates a high-speed operation mode (second operation mode), the high level of the mode signal 20 indicates a low-speed operation mode (first operation mod), and the high level of the mode signal 22 indicates a standby mode (third operation mode), respectively.

The clock control circuit 6 outputs the high-speed operating clock signal 16 to the functional block 8 as a clock signal 34 when the high-speed mode is specified by the signal 18, outputs the low-speed operating clock signal 30 thereto as the clock signal 34 when the lowspeed mode is specified by the mode signal 20, and outputs a logical value "0" ("L"), i.e., a signal fixed to a low level thereto as the clock signal 34 when the standby mode is specified by the mode signal 22.

Designated at numeral 54 is a reset signal (reset), which in turn is supplied to the switch control circuit 2 and the functional block 8.

Figure 2:
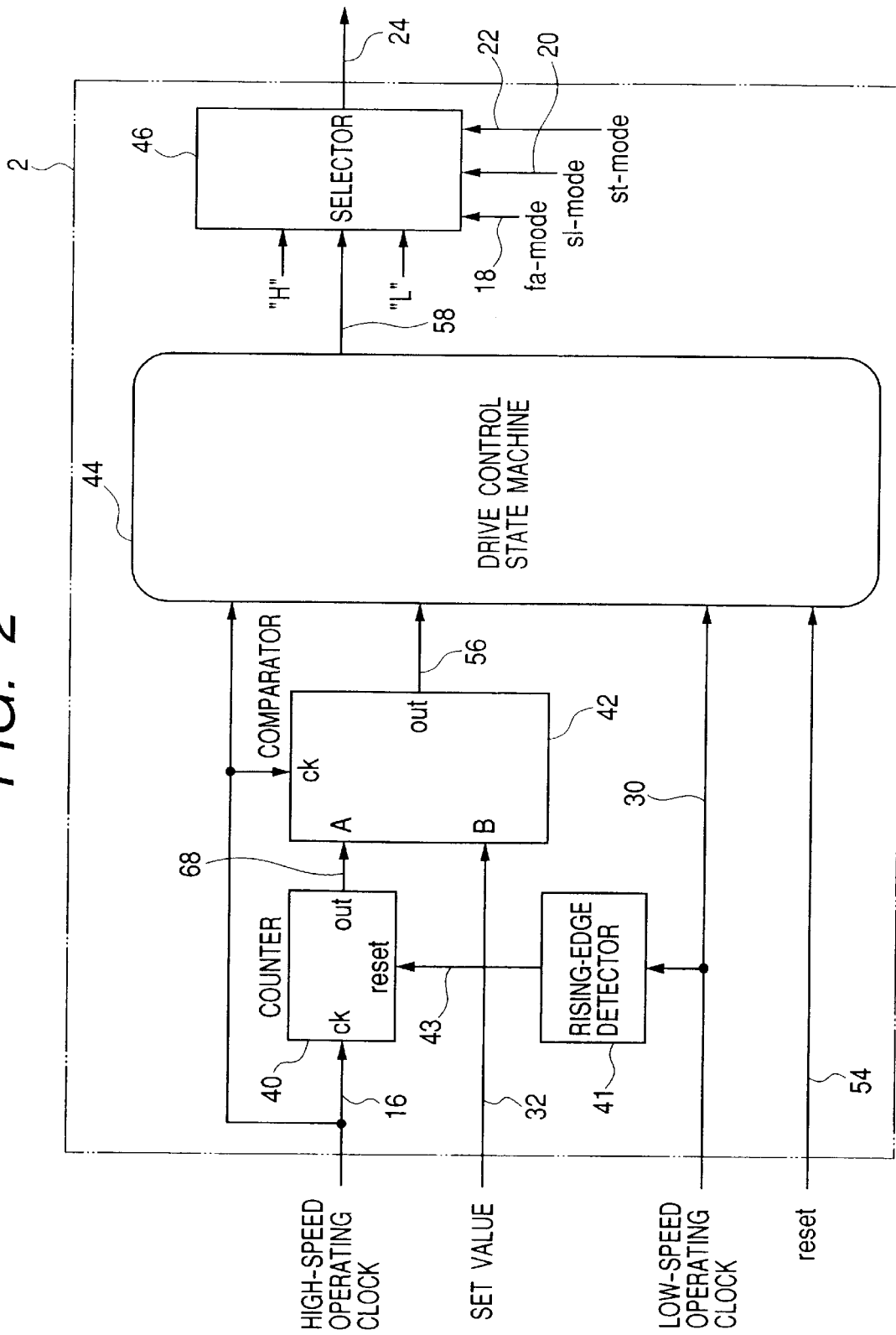
FIG. 2 is a block diagram illustrating one detailed example of a switch control circuit for power supply.

One detailed example of the switch control circuit 2 is shown in FIG. 2. The switch control circuit 2 has a counter 40, a rising-edge detector 41, a comparator 42, a drive control state machine 44, and a selector 46.

Figure 5:
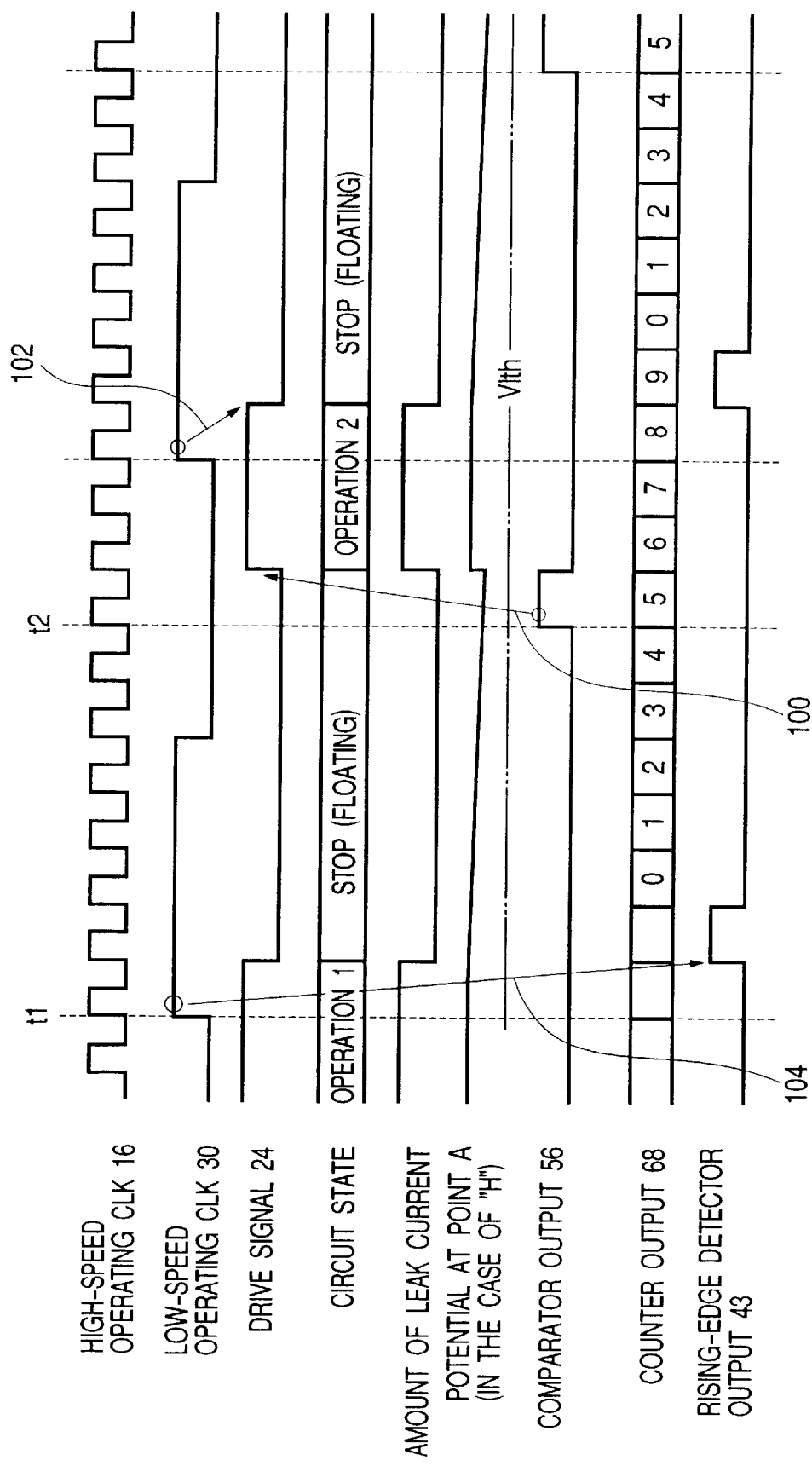
FIG. 5 is an operation timing chart used when a low-speed operation mode is specified under a configuration shown in FIG. 2.

The rising-edge detector 41 detects the rising edge of a clock signal 30 that is low in frequency. When the clock signal 30 rises at a time t1 in FIG. 5, by way of example, a signal 43 outputted from the rising-edge detector 41 is pulse-changed in response to a change in the clock signal 30. The counter 40 resets a count thereof to an initial value 0 in response to the high level of the edge-detected signal 43 outputted from the rising-edge detector 41, and thereafter counts a change in the high level of the high-speed operating clock signal 16. Referring to FIG. 5, by way of example, the counter 40 starts to count from the initial value in response to the pulse change in the edge-detected signal 43.

The comparator 42 compares a count 68 of the counter 40 and a set value 32 and detects a coincidence therebetween. The set value 32 is a value smaller than a division ratio of the clock signal 30 to the clock signal 16, for example, in other words, a value smaller than the value counted by the counter 40 for each cycle of the clock signal 30. Thus, a signal 56 changes for each cycle of the clock signal 30 before the clock signal 30 rises. When the set value is "5" in FIG. 5, by way of example, the signal 56 is pulse-changed at a time t2.

The drive control state machine 44 generates a signal 58, based on such a change in the signal 56 and the change in the clock signal 30. The signal 58 is a signal for switch-controlling the MOS transistors 12 and 14 so as to set an interval or period shorter than the cycle of the low-speed operating clock signal 30 as an on-operation period for each cycle of the clock signal 30. The signal 58 is outputted from the selector 46 as a switch control signal 24 for the MOS transistors 12 and 14. For example, the state machine 44 asserts the signal 58 (24) at a high level in response to the pulse change in the coincidence-detected signal 56 of the comparator 42 at the time t2 in FIG. 5. When the low-speed operating clock signal 30 is next brought to the high level, the state machine 44 negates the signal 58 (24) as the low level after one cycle of the clock signal 16.

The selector 46 selects a signal 58 outputted from the state machine 44, a high-level signal of a logical value "1" ("H") or a low level signal of a logical value "0" ("L") according to the states of the mode signals 18, 20 and 22 and outputs the selected one as a drive signal 24. Namely, the signal 24 is rendered "L" in the high-speed mode (fa-mode), whereby the transistors 12 and 14 are always brought to an on state. The signal 24 is rendered "'H" in the standby mode (st-mode) to bring the transistors 12 and 14 to a continuous off state whereby the supplying of the operating power to the functional block is blocked. In the low-speed mode (slmode), the signal 58 is selected as the drive signal 24.

Figure 3:
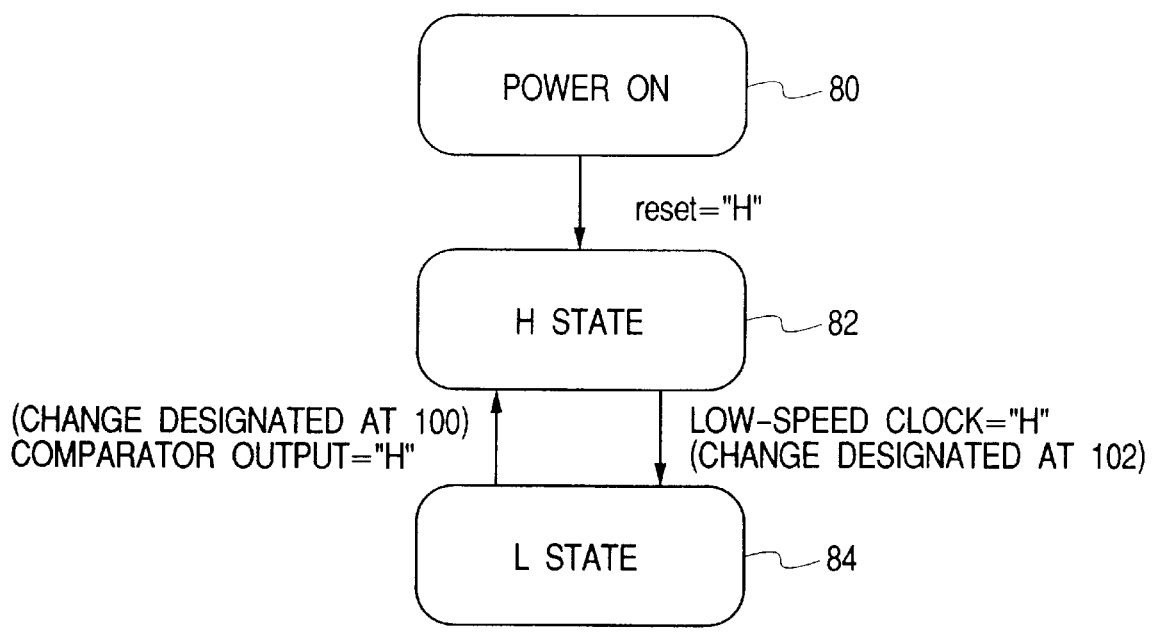
FIG. 3 is a state transition diagram of a drive control state machine.

A state transition diagram of the drive control state machine 44 is shown in FIG. 3. The output of the drive control state machine 44 is brought to a high level C"H") in an H state (power supply state) 82 and brought to a low level ("L") in an L state (power cut-off state) 84. The drive control state machine 44 starts from a power-on state 80 at power-on and transitions to the H state 82 in response to a reset signal of a high level generated by a system at power-on. When a change in the rising edge (change to the "H" level) occurs in the low-speed clock signal 30, the drive control state machine 44 is changed to the L state 84. Thereafter, when the output 56 of the comparator 42 is brought to the high level (changed to the ""H" level), the drive control state machine 44 returns to the H state. Further, when the lowspeed clock signal 30 is brought to the ""H" level, the drive control state machine 44 is changed to the L state 84 again. Thus, the H state and the L state can be repeated as needed.

Figure 4:
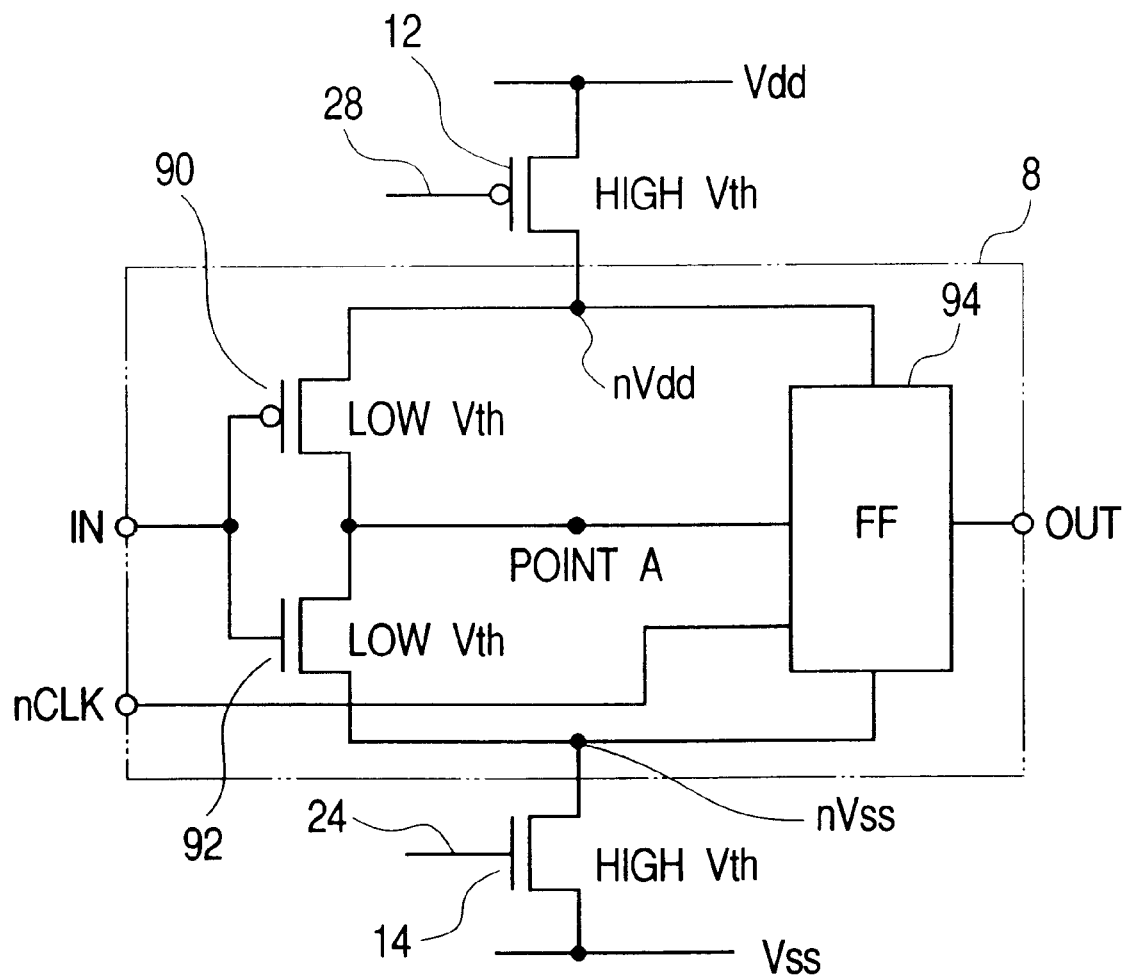
FIG. 4 is a block diagram depicting one example of a functional block.

One example of the functional block is shown in FIG. 4. For simplification of its description, the functional block has a one-stage CMOS inverter as a combinational circuit and a single flip-flop 94 as a sequence circuit. The CMOS inverter comprises a p channel type MOS transistor 90 and an n channel type MOS transistor 92. The threshold voltage of each MOS transistor constituting the functional block 8 is relatively low, whereas the threshold voltages of the MOS transistors 12 and 14 are rendered high. A high threshold voltage is also defined as a high Vth and a low threshold voltage is also defined as a low Vth. Although not restricted in particular, when the power-supply voltage is OV and an operation guarantee voltage for the power-supply voltage Vdd is 1V, for example, the threshold voltage of a high threshold voltage transistor is set so as to range from about 0.5V to about 0.7V, for example, and the threshold voltage of a low threshold voltage transistor is set so as to range form about 0.2V to about 0.3V, for example.

Figure 19:
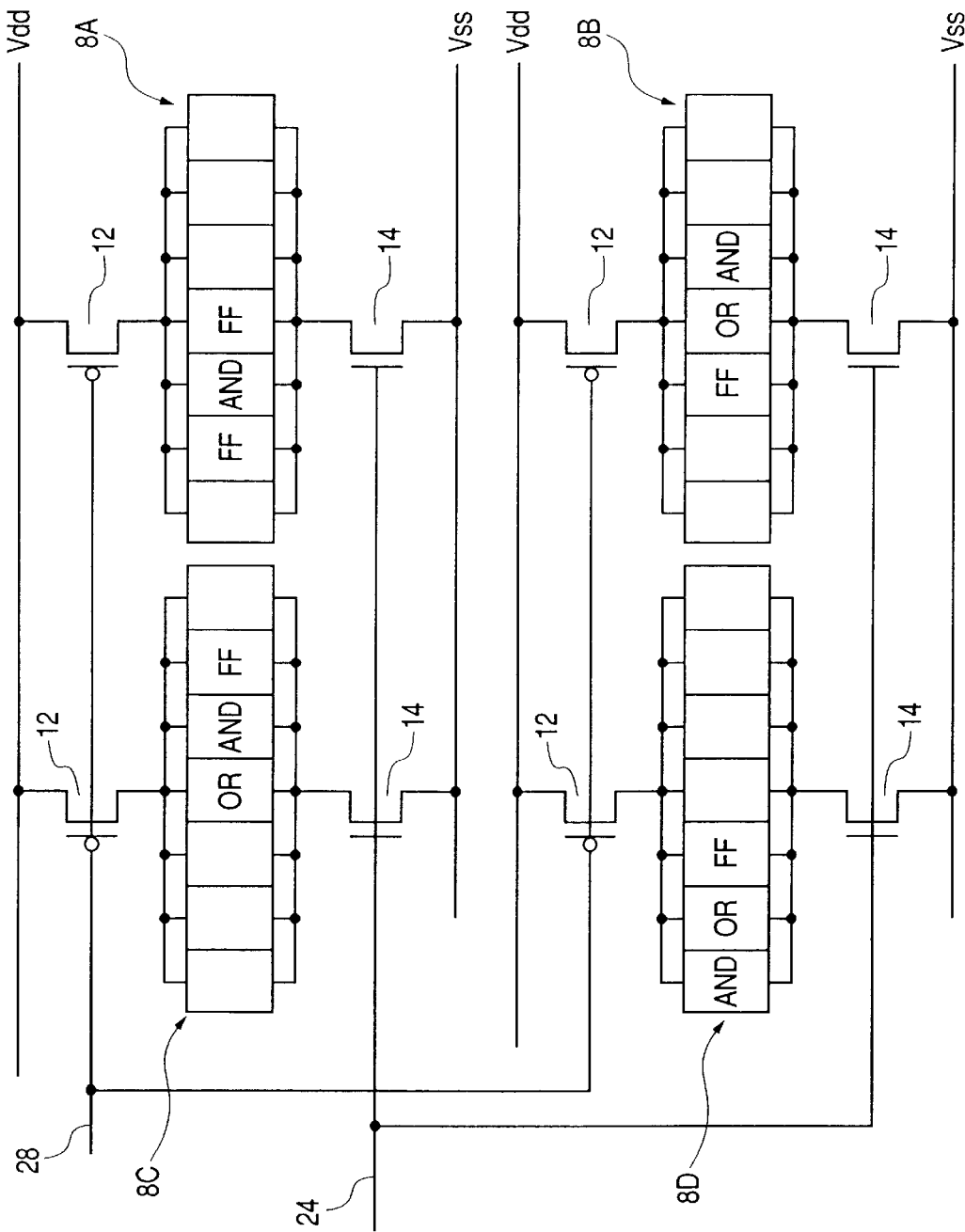
FIG. 19 is a layout diagram showing the layout of the functional block 8 shown in FIG. 1 on a semiconductor chip.

An example of the functional block 8 as viewed from a layout standpoint is shown in FIG. 19. Automatic layout wiring normally carries out layout design of a semiconductor integrated circuit. At this time, the functional block 8 used as a logic circuit block can be grasped as a circuit block corresponding to a functional unit such as an ALU, a register or the like. In the example shown in FIG. 19, the functional block 8 comprises four groups 8A through 8D in which a set of unit cells such as an OR gate (OR), an AND gate (AND), a flip-flop (FF), etc. is arranged with 2 rows and 2 columns. Although not restricted in particular, the respective unit cells are laid out in a region kept constant in height. MOS transistors 12 and 14 for power supply are comprised of MOS transistors whose gate widths are rendered wide to obtain necessary current supply capability for every group.

FIG. 5 shows an operation timing chart used when the low-speed operation mode is specified under a configuration shown in FIG. 2.

Now consider where for example, the low-speed operation mode is specified and the functional block 8 is operated in synchronism with the high-speed operating clock signal (which is also described simply as "CLK") 16. When the low-speed operating clock signal 30 first changes in its rising edge at the time t1, the state of the drive control state machine 44 shown in FIG. 3 changes from the H state 82 to the L state 84. Thus, an "L" level is outputted from the output 58 of the drive control state machine 44. Since the low-speed operation mode is specified and the mode signal (sl-mode) 20 is held "'H" at this time, the selector 46 selects the signal 58 and the drive signal 24 is brought to a low level. Thus, the MOS transistors 12 and 14 are turned off to block the supply of the operating power supplies Vdd and Vss to the functional block 8. A circuit state of the functional block 8 is brought to a stop (kept floating).

On the other hand, when the rising-edge detector 41 shown in FIG. 2 detects the rising edge of the low-speed operating clock signal 30 and outputs a pulse 43, thereby resetting the counter 40. Thereafter, the counter 40 counts the number of times that the clock signal 16 rises, from the initial value "0". The comparator 42 compares a count 68 with a set value 32. In the example shown in FIG. 5, the set value is defined as "5". When the output 68 of the counter 40 reaches "5", a coincidence-detected signal 56 is brought to an "H" level (see t2 in FIG. 5). The present signal is inputted to the drive state machine 44, so that the state thereof transitions from the L state 84 to the H state 82. Namely, a signal 58 outputted from the drive control state machine 44 is changed to an "H" level. Thus, the MOS transistors 12 and 14 are turned on to supply the operating power supplies Vdd and Vss to the functional block 8, whereby the functional block 8 is brought to an operable state.

Thereafter, when the operated state of the functional block 8 continues and the low-speed operating clock signal 30 changes in a rising edge, the transistors 12 and 14 are turned off after one clock cycle of the high-speed operating clock signal 16, whereby the functional block 8 is brought to a deactivated state again. In the present deactivated state, an internal node of the functional block 8 is brought to a floating state and will hold an electrical charge at this time therein.

Here, the functional block 8 is designed so as to be capable of operation in synchronism with the high-speed operating clock signal 16. In other words, when a delay in operation is taken into consideration at the maximum operation frequency allowed for the clock signal 16, the operation of the combinational circuit can follow a latch operation of the sequence circuit. Therefore, if the time required for the low-speed operating clock to rise since the circuit state of the functional block 8 reaches an operating state, is equivalent to a time interval greater than or equal to one cycle of the high-speed operating clock signal 16, then the functional block 8 can be operated theoretically. Upon low-speed operation, the signal 24 brings the MOS transistors 12 and 14 to an on state by a time interval enough to assure or guarantee the normal operation within one cycle of the low-speed clock signal 30, whereby operating power is supplied to the functional block 8. It is therefore possible to reduce the leak current flowing through each turned-off transistor in a state subsequent to the determination of the output of the combinational circuit. In a state of "'stop (floating)" in FIG. 5, the circuit operation of the functional block is determined in a state of "operation" up to the stop state, and the on state and the off state of each transistor lying within the functional block 8 are determined. When the supply of the power to the functional block 8 is cut off after such a state, the internal node in the circuit is brought to a floating level and will hold the state of an electrical charge at that time therein. In other words, little leak current directed to a ground terminal is produced in each turned-off transistor at this time. The waveform of the amount of the leak current corresponding to the period of "stop (floating)" in FIG. 5 means such an event. However, the electrical charge directed to the semiconductor substrate slightly leaks at the internal node in the circuit, and the potential at the internal node in the circuit will drop gradually. A "potential at a point A" in FIG. 5 indicates a change in such a potential at a high level node. No problem arises unless such a change in potential reaches such an extent as to cross a logic threshold voltage V1th of the logic circuit constituting the functional block 8.

In the example shown in FIG. 5, the leak current flowing through each turned-off transistor can be reduced to about ⅓. The rate of a reduction in leak current can be rendered high as the difference between the frequency of the high-speed operating clock signal and the frequency of the low-speed operating clock signal increases. When, for example, the frequency of the high-speed clock signal is 50 MHz and the frequency of the lowspeed clock signal is 100 KHz, the leak current can be reduced to about ¹⁄₂₅₀.

Figure 6:
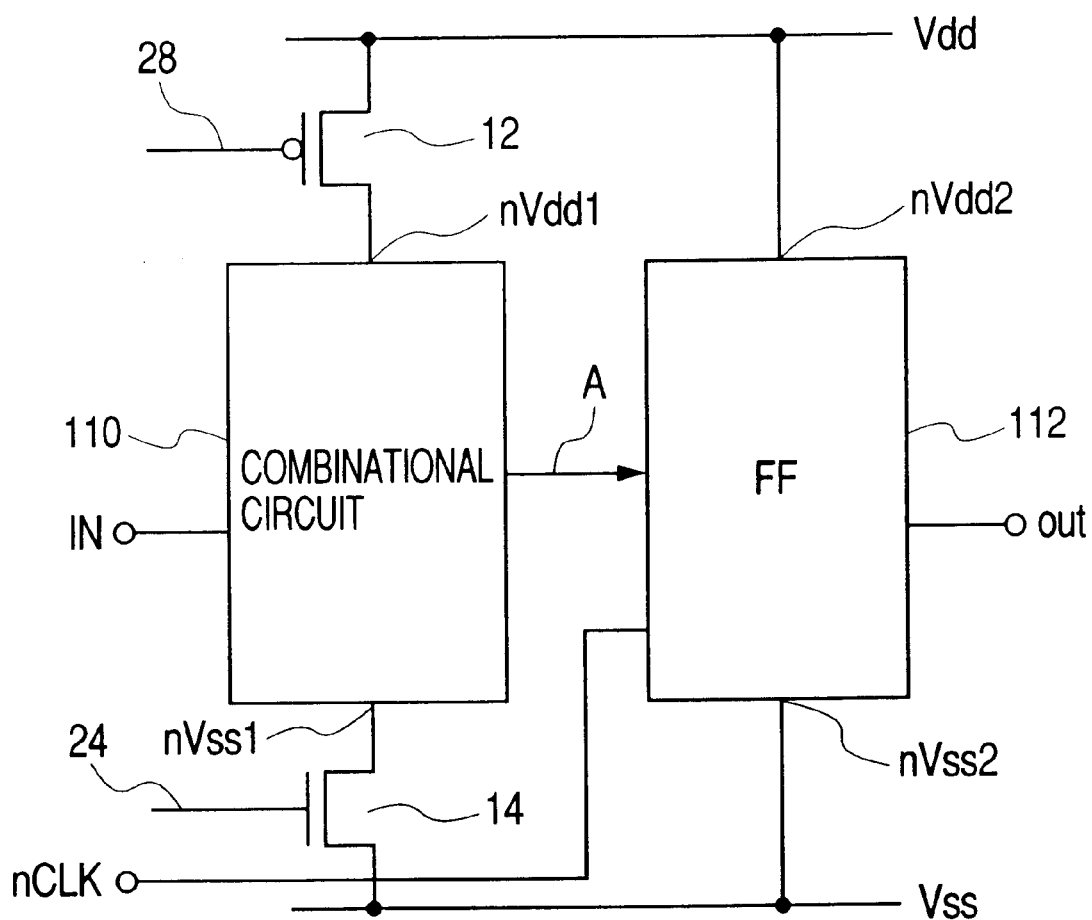
FIG. 6 is a block diagram showing another example of the functional block.

Another example of the functional block is shown in FIG. 6. In the example illustrated in the same drawing, first and second source or power-supply nodes nVdd2 and nVss2 of a sequence circuit (FF) 112 are always supplied with power -supplies Vdd and Vss, respectively. First and second power-supply nodes nVdd1 and nVss1 of a combinational circuit 110 are supplied with the power supplies Vdd and Vss through MOS transistors 12 and 14, respectively. According to the example, even if the potential at an output node A of the combinational circuit 110 is gradually lowered as described in FIG. 5 upon cutting off of the operating power supplies to the combinational circuit 110, the power supplies are supplied to the flip-flop (FF) 112 and hence there is no fear that stored information will suffer damage. While the configuration shown in FIG. 6 has a high degree of reliability in this point of view, the effect of reducing the leak current is poor as compared with the case shown in FIG. 4. Further, the flip-flop 112 is always supplied with the power supplies. Thus, there is no fear that data will be damaged due to the leakage of an electrical charge at power cut-off, and the operating clock signal in the circuit can be delayed unlimitedly.

Figure 7:
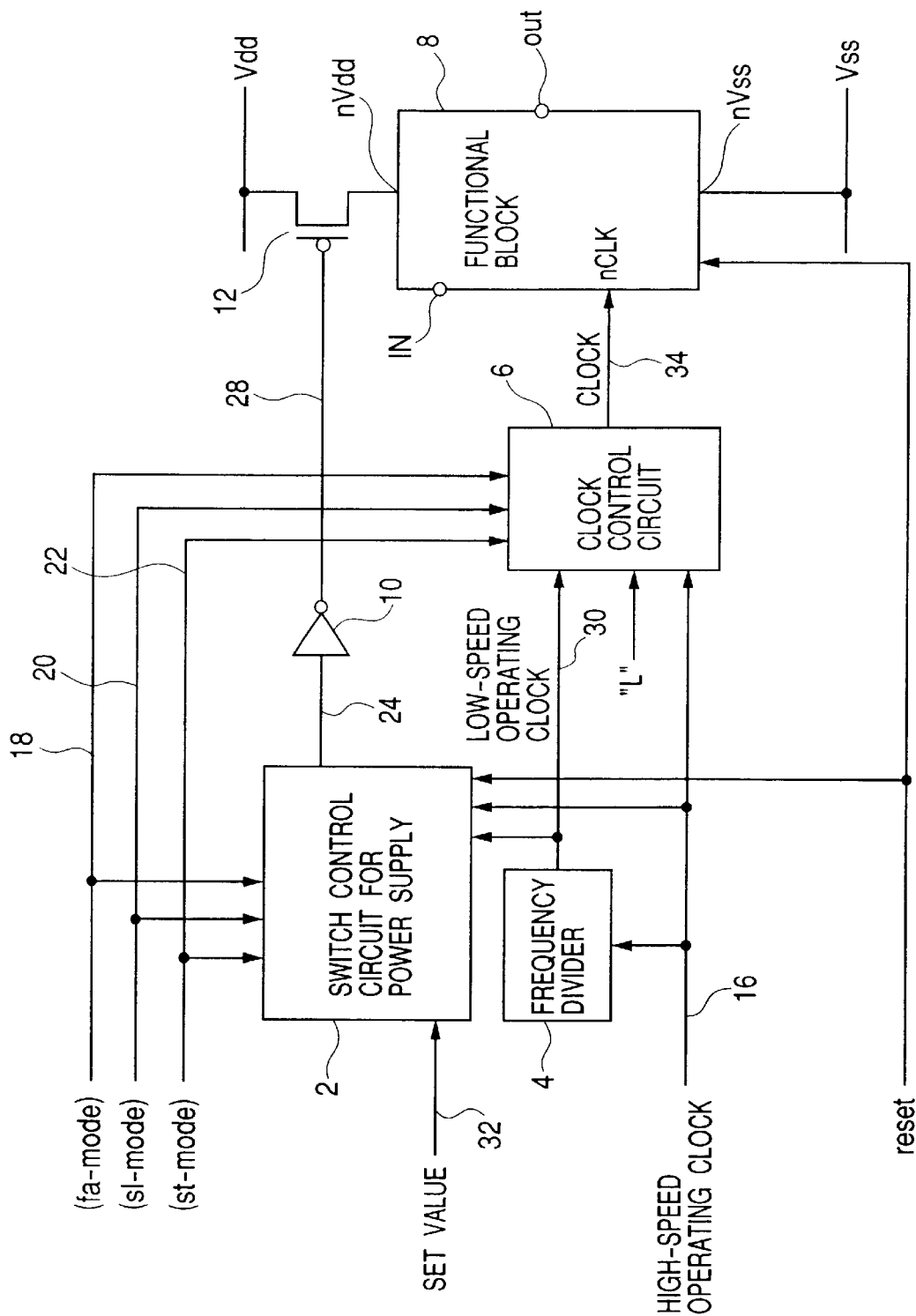
FIG. 7 is a block diagram showing a second embodiment of a semiconductor integrated circuit according to the present invention.
Figure 8:
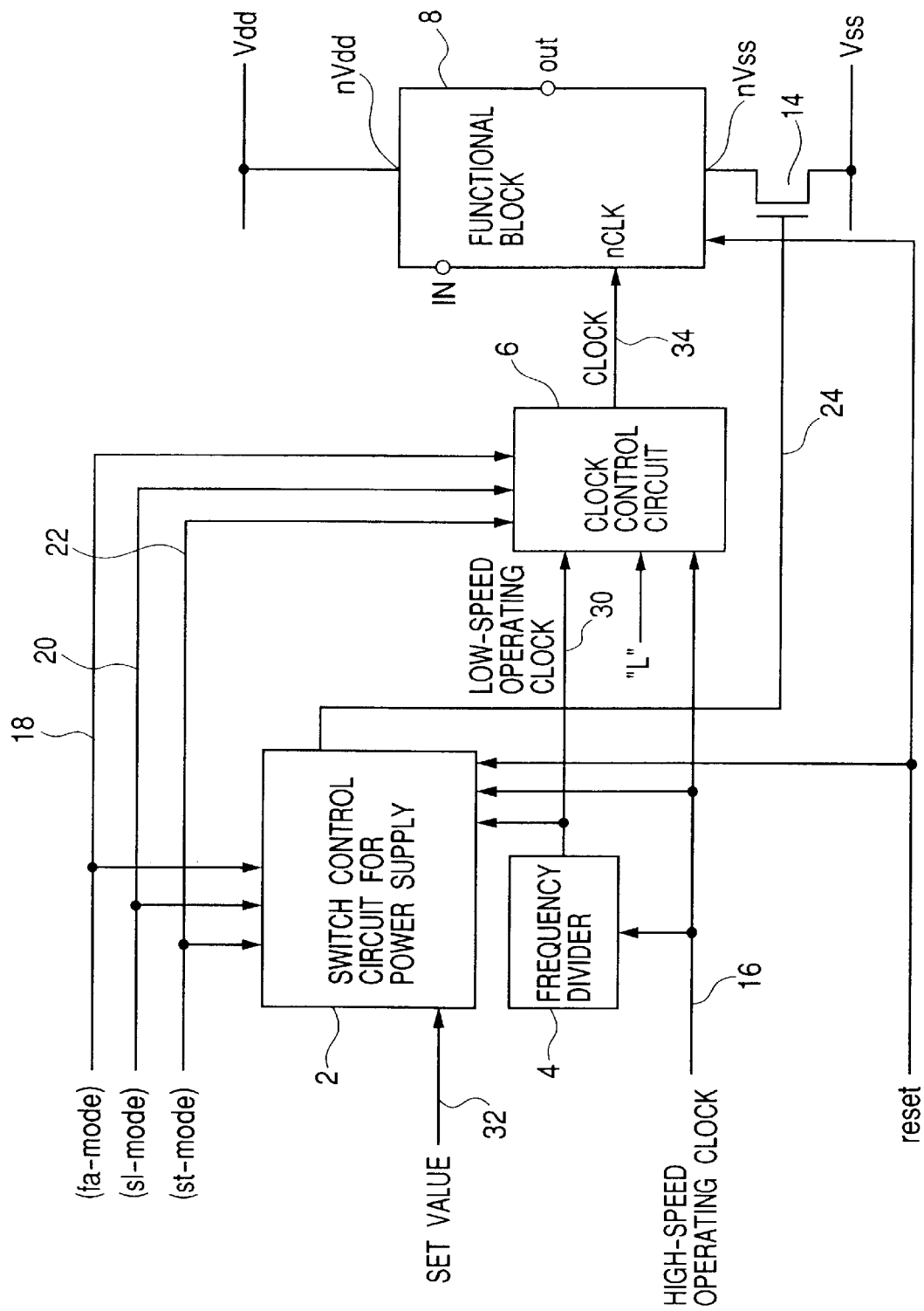
FIG. 8 is a block diagram illustrating a third embodiment of a semiconductor integrated circuit according to the present invention.

A second embodiment of a semiconductor integrated circuit according to the present invention is shown in FIG. 7. A third embodiment of a semiconductor integrated circuit according to the present invention is shown in FIG. 8. The second embodiment is different from the first embodiment in that a MOS transistor for the power supply is provided on the power-supply voltage Vdd side alone. The third embodiment is different from the first embodiment in that a MOS transistor for supplying power is provided on the ground voltage Vss side alone. Other configurations are identical to those employed in the first embodiment. In the second embodiment, a source current is supplied from the power-supply voltage Vdd side alone when a circuit is changed from a deactivated state to an activated state. Therefore, the time required to return to the original potential becomes long. Since, however, the number of the MOS transistors for power supply may be half, a circuit scale or the occupied area of each chip can be reduced, and the present embodiment is useful in applications that have no specific speed requirement. Further, the third embodiment is also similar to the above. In the first embodiment as compared with the second and third embodiments, the time required to return from the power cut-off state to the power supply state can be shortened.

Figure 9:
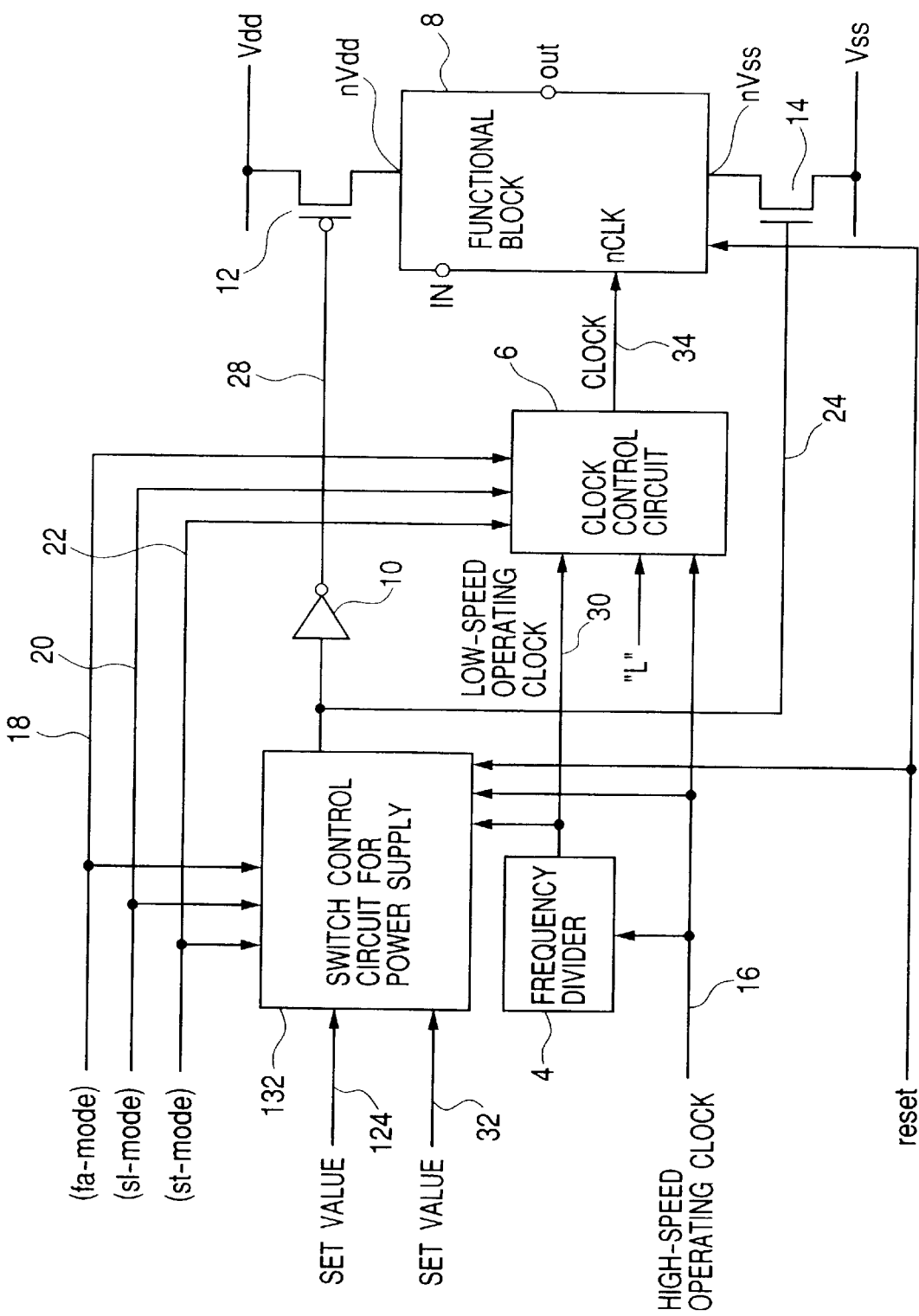
FIG. 9 is a block diagram depicting a fourth embodiment of a semiconductor integrated circuit according to the present invention.

A fourth embodiment of a semiconductor integrated circuit according to the present invention is shown in FIG. 9. A configuration of the fourth embodiment is one wherein a refresh operation is regularly effected on an internal node of a functional block 8 in a low-speed operation mode to increase data holding performance. An entire configuration thereof is shown in FIG. 9. The present embodiment is different from the first embodiment in terms of a configuration of a switch control circuit 132 for power supply. A second set value 124 defined as the reference for generating timing provided for the refresh is inputted to the switch control circuit 132.

Figure 10:
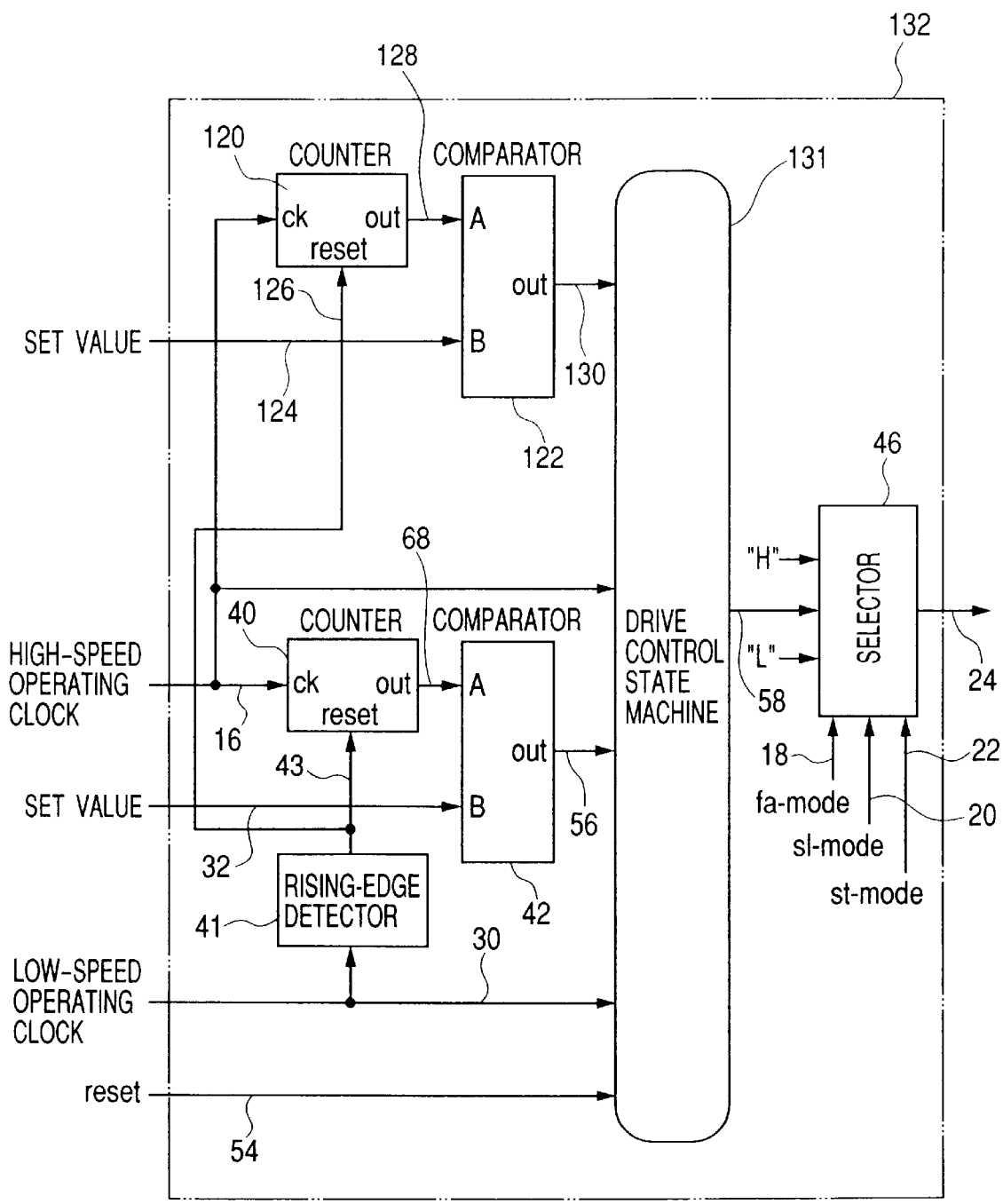
FIG. 10 is a block diagram showing one detailed example of a switch control circuit for power supply, which is employed in the fourth embodiment.

One detailed example of the switch control circuit 132 is shown in FIG. 10. The configuration of the switch control circuit is different from the configuration shown in FIG. 2 in terms of the additional provision of a counter 120 and a comparator 122 and the logic of a drive control state machine 131. The counter 120 resets a count thereof to an initial value 0 according to the output of a rising-edge detector 41 in a manner similar to the first embodiment. The comparator 122 compares an output 128 of the counter 120 and the second set value 124. A coincidence-detected signal 103 is supplied to the drive control state machine 131.

Figure 11:
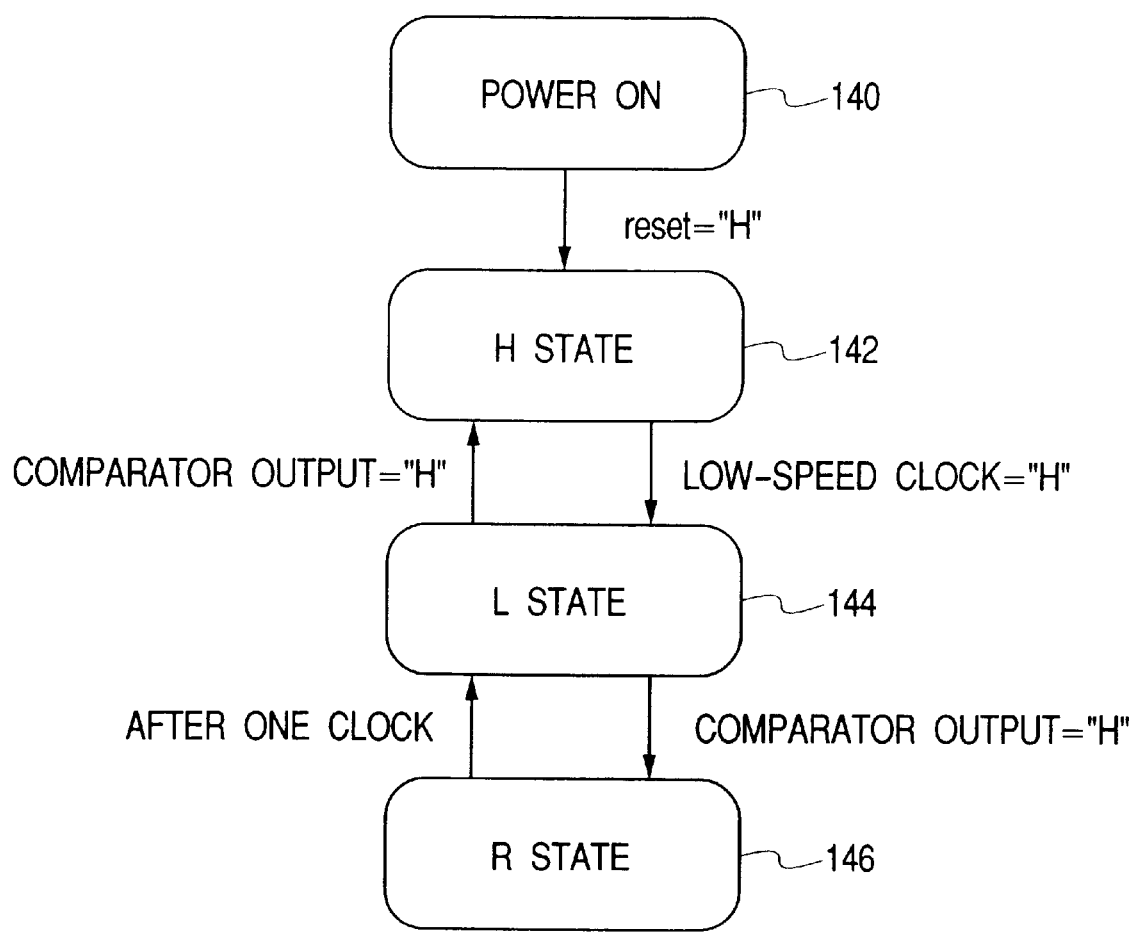
FIG. 11 is a state transition diagram of a drive control state machine employed in the fourth embodiment.

A state transition diagram of the drive control state machine 131 is shown in FIG. 11. The present state machine 131 is activated in synchronism with a high-speed operating clock signal 16. Further, the output of the drive control state machine 131 is brought to an ""H" level in an H state (high-speed operation state) 142, an "L" level in an L state (low-speed operation state) 144, and the "H" level in an R state (refresh state) 146, respectively. The drive control state machine 131 starts from a power-on state 140 at power-on and is caused to transition to the H state 142 in response to a reset signal of an ""H" level generated by a system at power-on. When a low-speed operating clock signal 30 is brought to "H" level, the drive control state machine 131 is changed to the L state 144. Thereafter, when the output of the comparator 122, which detects timing provided to make refresh, is rendered "'H", the drive control state machine 131 is changed to the R state 146. In the present state, the drive control state machine 131 is automatically changed to the L state 144 after one cycle of the clock signal 16. Namely, drive signals for MOS transistors 12 and 14 for power supply are rendered "H" during one cycle of the clock signal 16 to temporarily supply power-supply voltages Vdd and Vss to the functional block 8, whereby the internal node in the circuit is refreshed. Thereafter, when the output of a comparator 42 reaches "H", the drive control state machine is changed to the H state in a manner similar to the first embodiment.

Figure 12:
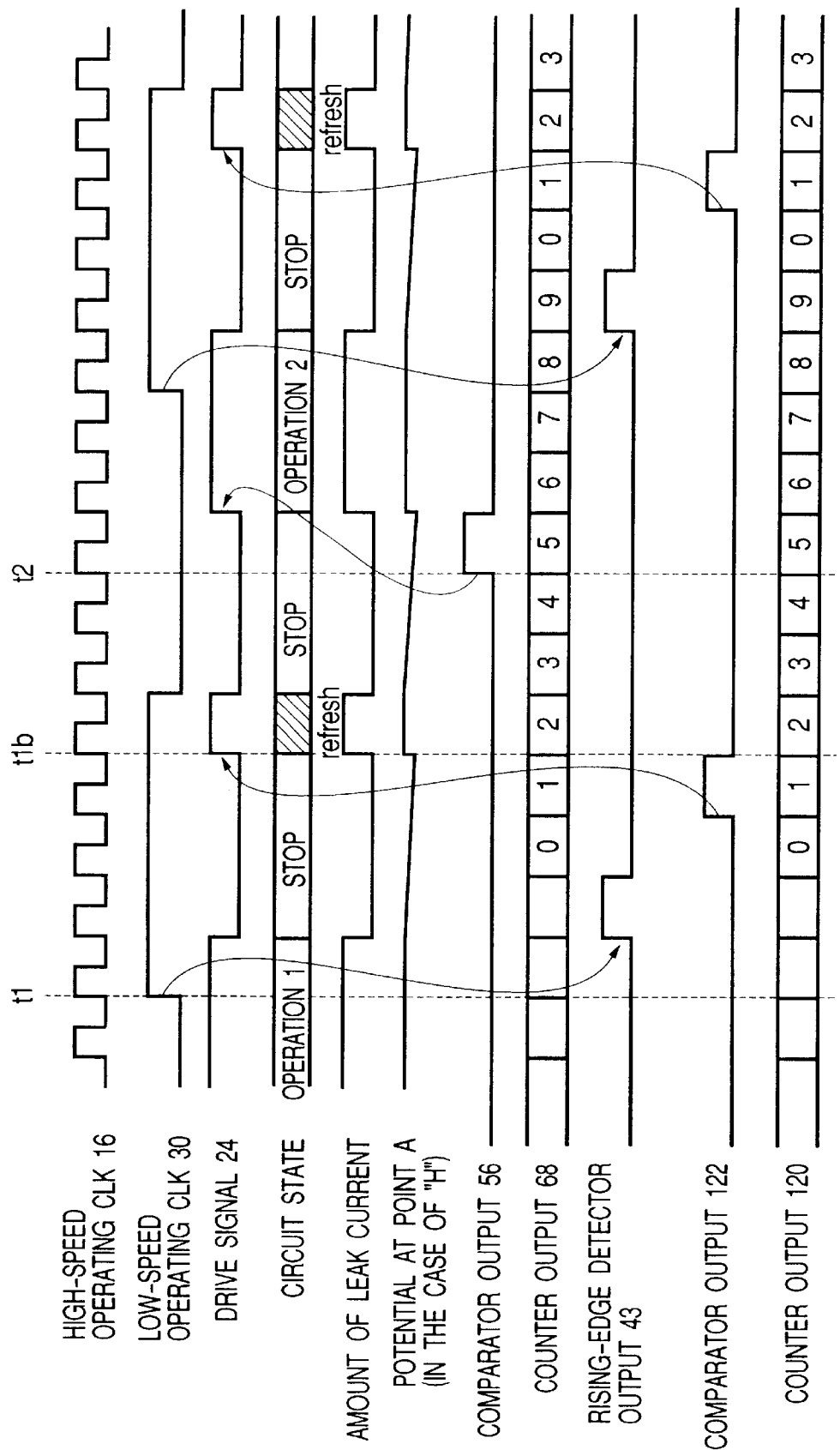
FIG. 12 is an operation timing chart used when a low-speed operation mode is specified under a configuration shown in FIG. 10.

An operation timing chart used when the low-speed operation mode is specified under the configuration shown in FIG. 10, is shown in FIG. 12. Timings provided for a comparator 56, a counter 40 and a rising-edge detector 43 are represented as described in the first embodiment. In the fourth embodiment, the counter 120 and the comparator 122 are operated together with them. The counter 120 is reset in response to a pulse 43 of a rising-edge detector 41 to thereby start the counting of the number of cycles of the high-sped operating clock signal 16. A count 128 of the counter 120 is compared with the second set value 124 by the comparator 122. In the present example, the set value is defined as "1". When the count of the counter 120 reaches 1, a coincidence signal 130 of an "H" level is outputted from the comparator 122 with its timing. The coincidence signal 130 is inputted the drive control state machine 131. In response to the signal 130, the drive control state machine 131 is changed from the L state 144 to the R state 146. Thus, the MOS transistors 12 and 14 are turned on to supply the power-supply voltages Vdd and Vss to the functional block 8, whereby each node (e.g., the point A in FIG. 4) in the circuit is restored to an on-operation potential (at a time t1b). During a period in which the internal node of the functional block 8 is brought to a floating state, the node is refreshed at predetermined intervals in this way, thereby making it possible to prevent data from suffering damage when a floating time is long.

Figure 13:
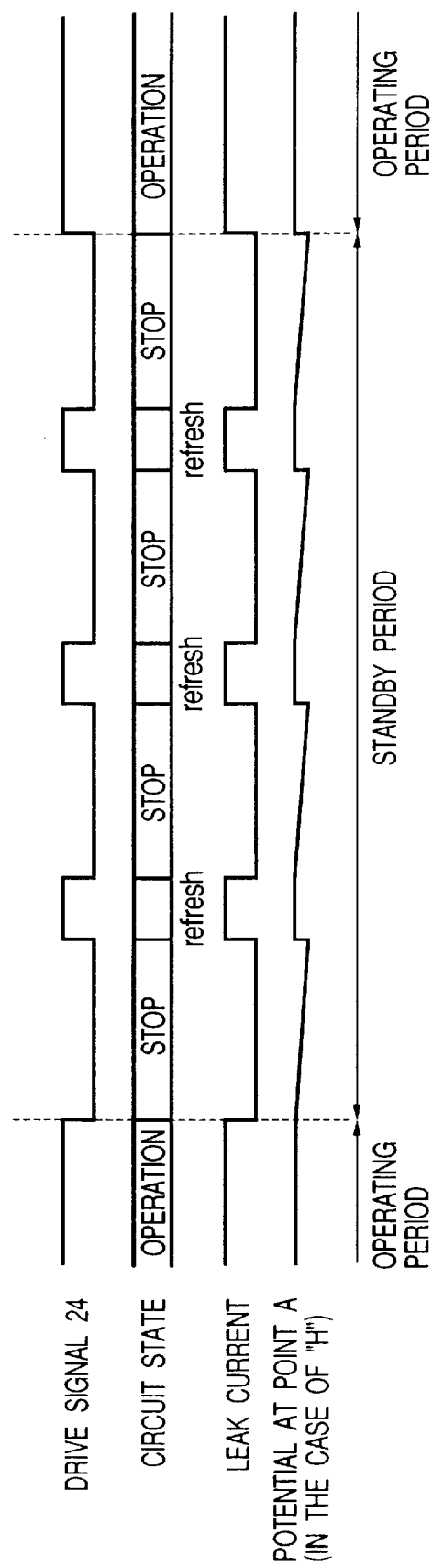
FIG. 13 is a timing chart used when a refresh operation is carried out in a standby mode.

While the refresh operation used in the fourth embodiment is carried out in the low-speed operation mode, a similar refresh operation can be carried out in a standby mode. Namely, when the standby mode is given to a selector 46 according to a standby signal (st-mode) 22, the selector 46 may select a signal 58. In the present example, the logic of generating the signal 58 is kept active even in a standby state. FIG. 13 schematically shows a timing chart at that time. This allows data to be protected from damage during the standby period. A change in the low-speed operating clock signal 30 may be brought to a halt in the standby mode. Namely, a frequency divider 4 may stop dividing.

Figure 14:
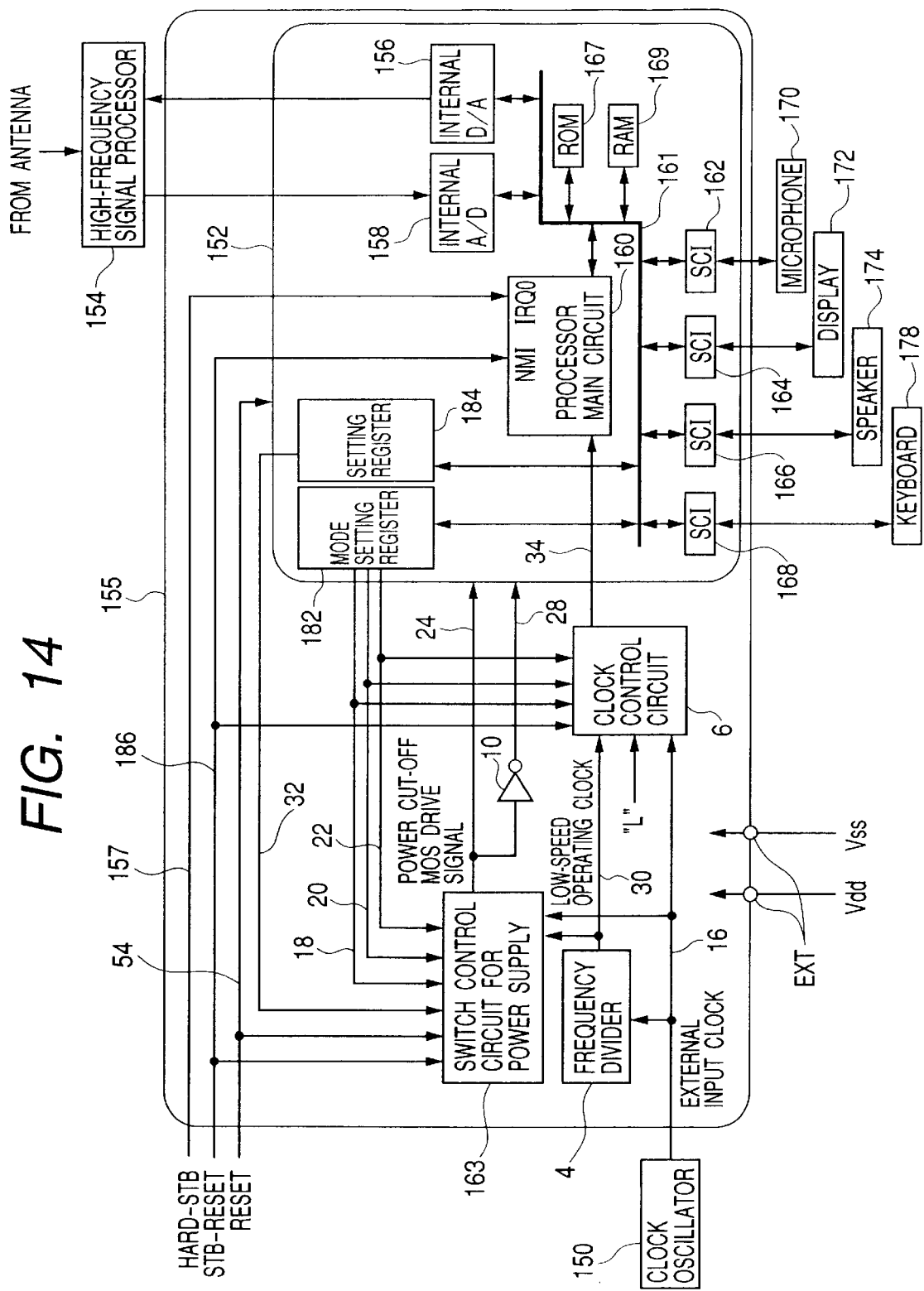
FIG. 14 is a block diagram showing a personal digital assistant defined as a fifth embodiment of the present invention.

A portable information terminal device or personal digital assistant defined as a fifth embodiment of the present invention is shown in FIG. 14. In FIG. 14, a circuit portion specified by reference numeral 152 indicates the portion associated with the functional block 8 described in the first embodiment. The circuit portion 152 is ranked as a set of a plurality of logic circuit blocks and subjected to power-supply control based on the MOS transistors for power supply and clock control.

Designated at numeral 155 is a processor chip used as a data processor or processing equipment or system brought into a semiconductor integrated circuit. A clock oscillator 150, a high-frequency signal processor 154, a keyboard 178, a speaker 174, a display 172, a microphone 170, etc. are connected to the outside of the processor chip 155. The personal digital assistant used as a data processing system is configured as a whole. A circuit, which constitutes the personal digital assistant, is placed on a mounting board not shown in the drawing. Incidentally, EXT indicate terminals supplied with source or power-supply potentials Vdd and Vss, respectively.

The clock oscillator 150 supplies a clock signal 16 used in the processor chip 155 in a high-speed mode. Further, the high-frequency signal processor 154 is connected to an antenna and has the function of modulating a baseband-based signal outputted from the processor chip 155 and the function of demodulating a signal inputted from the antenna and converting it to its corresponding baseband-based signal. A hardware standby signal. (HARD-STB) 157 generated on the mounting board and a standby reset signal (STB-RESET) 186 for releasing hardware standby are inputted to the processor chip 155.

The circuit block 152 incorporates therein a processor main circuit 160; a processor bus 161; an analog-digital (A/D) converter 158, a digital-analog (D/A) converter 156, four serial communication interfaces (SCI) 162, 164, 166, 168, a ROM 167 and a RAM 169; etc., which are respectively connected to the processor bus 161. The A/D 158 converts a demodulated analog signal outputted from the high-frequency signal processor 154 to a digital signal and supplies it to the processor main circuit 160. The D/A 156 has the role of receiving transmit data outputted from the processor main circuit 160 therein and converting it to an analog value, and supplying it to the high-frequency signal processor 154. Further, the four serial communication interfaces 162, 164, 166 and 168 respectively have the role of supplying signals sent from external devices to which they are respectively connected, to the processor bus 161. A mode setting register 182 and a setting register 184 are provided for the processor bus 161 and are capable of being write/read-accessed by the processor main circuit 160. The set value 32 employed in the first embodiment is stored in the setting register 184. Mode set information about mode signals 18, 20 and 22 are stored in the mode setting register 182. Incidentally, the set value 124 shown in FIG. 9 can also be supplied to a switch control circuit 163 by providing another setting register similar to the setting register 184 inside the circuit block 152.

Figure 15:
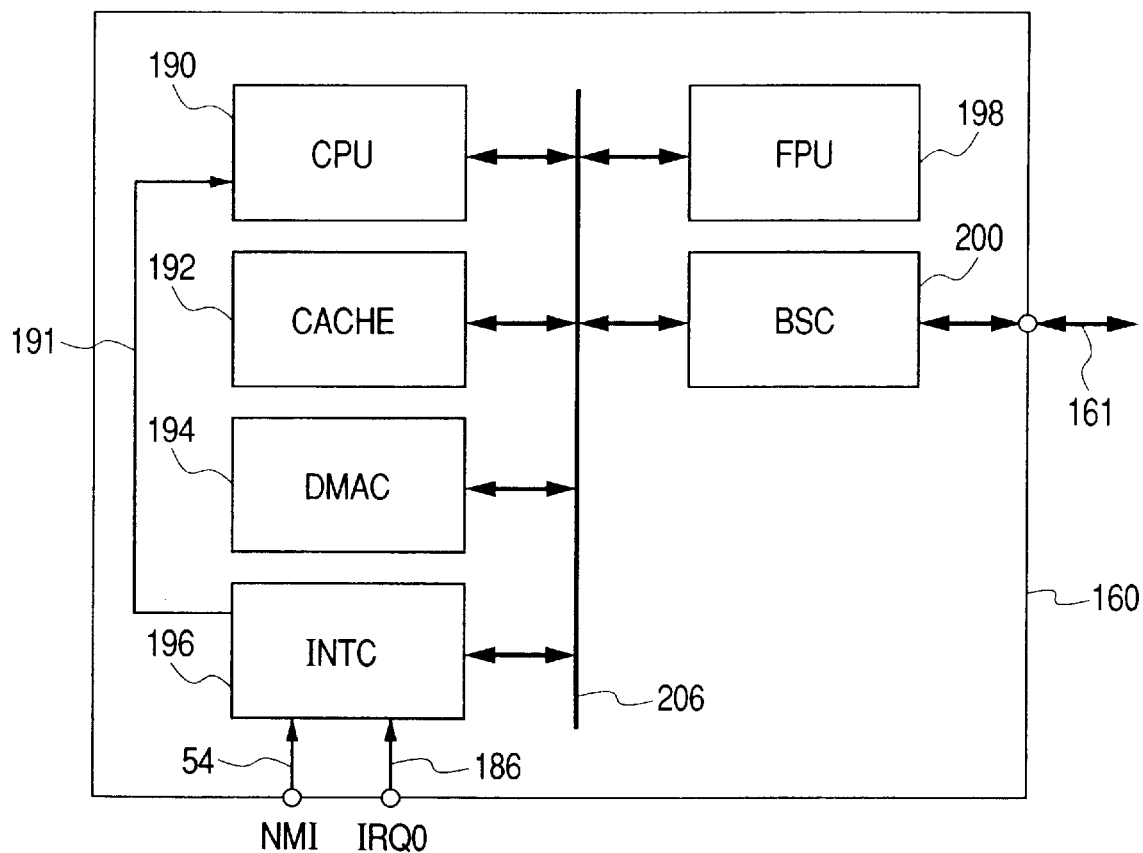
FIG. 15 is a block diagram illustrating one example of an internal configuration included in a processor main circuit.

One detailed example of the processor main circuit 160 is shown in FIG. 15. The processor main circuit 160 includes a CPU core 190 defined as a central processing unit, a cache memory 192, a direct memory access controller (DMAC) 194, an interrupt controller (INTC) 196, a floating-point unit (FPU) 198, a bus state controller (BSC) 200, etc., which in turn are connected to a bus 206. The bus state controller (BSC) 200 is connected to the processor bus 161 and starts up and controls bus access.

The interrupt controller (INTC) 196 inputs or receives a non-maskable interrupt signal (NMI signal) 54 and a plurality of maskable interrupt signals (IRQO signals) 186, etc. therein to perform priority control and mask control on an interrupt request, thereby supplying one interrupt signal 191 to the CPU 190.

The processor main circuit 160 controls the entire system and performs a communication protocol process, various filtering processes, etc.

Here, power-supply control and clock control on the circuit block 152 by the MOS transistors for power supply are not completely the same to all the circuits. When a standby state is given to the processor chip 156, at least the supply of operating power and a clock signal to the interrupt controller 196 is maintained, so that the processor chip is allowed to operate. In the present example, the supplying of the operating power and the clock signal to other circuits is stopped in the standby state. Such controls are performed as follows: Transmission paths used for a switch control signal 24 and a clock signal 34 for MOS transistors for power supply in the switch control circuit 163 and the clock control circuit 6 are separately set by the interrupt controller 196 and other circuits. The clock control and power-supply control may be effected on the former in response to the high-speed and low-speed modes, whereas clock control and power-supply control responsive to the high-speed, low-speed and standby modes may be effected on the latter.

Figure 16:
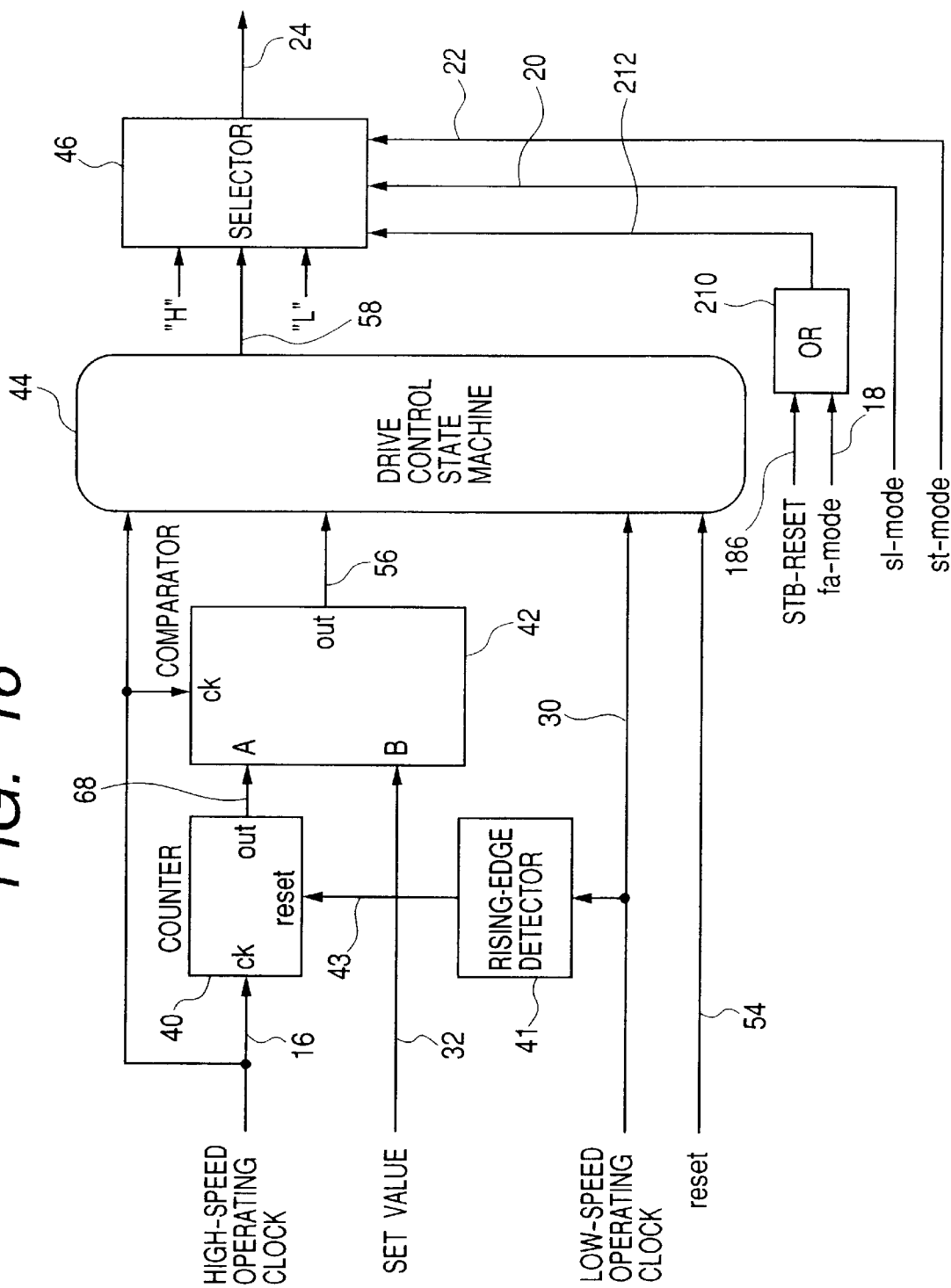
FIG. 16 is a block diagram showing one detailed example of a switch control circuit for power supply, which is employed in the fifth embodiment.

One detailed example of the switch control circuit 163 is shown in FIG. 16. As compared with the circuit 2 shown in the first embodiment, a signal (STB-RESET) 186 for releasing or resetting hardware standby is inputted in a configuration shown in the same drawing. The signal 186 and a high-speed mode (fa-mode) 18 indicated at a 0th bit of the mode setting register 182 are inputted to an OR gate 210, and a logical OR signal 212 thereof is inputted to a selector 46. other configurations are identical to those employed in the first embodiment.

Figure 17:
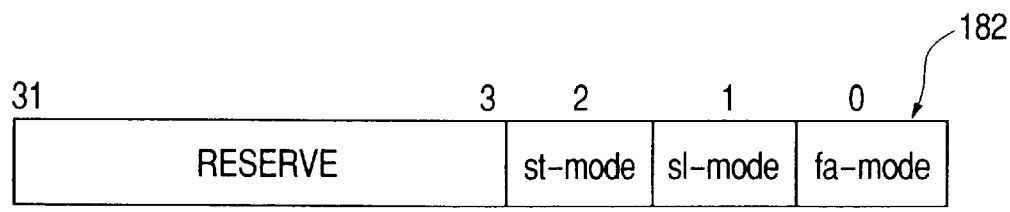
FIG. 17 is a format diagram illustrating one example of an assignment of information storage areas in a mode set register.

An assignment of information storage areas in the mode setting register 182 is shown in FIG. 17. A 0th bit is referred to as a fa-mode bit. When it is desired to activate the processor chip 155 in the high-speed mode, "1" is set thereto, and it is reset to "0" in the case of other modes. Further, a first bit is referred to as an sl-mode bit. When it is desired to activate the processor chip 155 in the low-speed mode, "1" is set thereto, and it is rest to "0" in the case of other modes. Furthermore, a second bit is referred to as an st-mode bit. When it is desired to bring the processor chip 155 to a standby mode, it is set to "1", and it is reset to "0" in the case of other modes. A bit other than these is defined as a reserve bit.

Operation modes of the processor chip 155 are shown in FIG. 18. In a high-speed operation mode for setting the fa-mode bit, a clock frequency is rendered high in speed, and each MOS transistor for power supply is always kept on. Namely, the dynamic current generated by turning on and off each MOS transistor increases, and a static current whose main component is comprised of leak current, also increases. Since large throughput capacity is obtained in the operation mode, the operation mode is used for the execution of an application program by a PDA or the like and call processing of a cellular phone or the like, for example.

In a low-speed operation mode for setting the sl-mode bit, the clock frequency is rendered low in speed, and each MOS transistor for supplying power is intermittently turned on by application of the present invention. Namely, the dynamic current produced by the MOS transistor decreases, and the static current whose main component is comprised of the leak current, also decreases. Since throughput capacity is small in the present operation mode, the operation mode is used for the wait processing of the cellular phone, for example.

In a standby mode for setting the st-mode bit, the clock is brought to a supply halt, and the MOS transistor is always kept off. Namely, the dynamic current generated by the MOS transistor disappears and the static current decreases. The present mode is used to implement a suspend state of a personal computer, a PDA or the like.

The operation of the personal digital assistant shown in FIG. 14 will next be described. When the power of the system is turned on, a reset signal 54 generated on the mounting board is inputted to the processor chip 155, so that the switch control circuit 163 for power supply and the functional block 152 are initialized. At this time, the mode setting register 182 initially sets the fa-mode bit to a set state. Thus, the switch control circuit 163 starts to operate in the high-speed mode. In the processor main circuit 160, the CPU 190 decodes an instruction read from the ROM 167 and starts its execution. Thus, the personal digital assistant rises in the high-speed mode.

Next, when the CPU 190 is shifted to the low-speed operation mode while being operated according to a program stored in the ROM 167, the processor main circuit 160 loads, for example, a set value "5" into the setting register 184 and next brings the sl-mode bit of the mode setting register 182 to a set state. Thus, the switch control circuit 163 turns on the MOS transistors 12 and 14 before the rising of the low-speed operating clock 30 as described in the first embodiment and inverts the MOS transistors 12 and 14 to an off state after the rising of the same clock signal 12 and 14, thereby intermittently supplying operating power to each circuit of the functional block 152.

Further, when the CPU 190 executes its operation program and is thereby shifted to the standby mode, the processor main circuit 160 sets the st-mode bit of the mode setting register 182. Thus, an output signal line 212 of the OR gate 210 is rendered "H" in FIG. 16 and hence the selector 46 selects "L" and brings an output signal 24 to "L". Thus, the functional block 152 is separated from the power-supply voltage Vdd and the ground voltage Vss and cut off from the supply of the operating clock signal, thereby resulting in a standby state. Although not shown in the drawing in particular, the interrupt controller 196 is still supplied with the operating power and the clock signal as described above in the standby state.

When instructions for the standby state is given from outside the processor chip 155, a hardware standby signal (HARD-STB) 157 is generated on the mounting board. The signal 157 is inputted to the processor main circuit 160 as an interrupt signal IRQO. The CPU 190 having accepted the corresponding interrupt sets the st-mode bit of the mode setting register 182 according to an interrupt routine and is changed to the standby mode itself as well. The CPU 190 is capable of coping even with instructions given from outside.

Resetting from the standby state is carried out according to an externally given NMI interrupt. Now consider where, for example, a user pushes a standby reset switch provided on a personal digital assistant. Thus, a standby reset signal (STB-RESET) 186 is inputted to the switch control circuit 163, the clock control circuit 6 and the processor chip 155, on the mounting board. When the standby reset signal (STB-RESET) 186 is brought to an active state, the switch control circuit 163 resets a power supply cut-off state and the clock control circuit 6 resets a clock signal supply stop state, during the activate state of the signal 186. Thus, the CPU 190 and the like are returned to an operable state. In the processor main circuit 160, the standby reset signal (STB-RESET) 186 is set as an NMI signal. The CPU 190 starts a predetermined interrupt process according to an interrupt based on the interrupt signal and sets a fsmode bit to the mode setting register 182 to reset the standby state. Thus, the processor chip 155 can be operated in the high-speed operation mode.

In the personal digital assistant as described above, signal processing and protocol processing can be carried out at high speed in a communication state by setting the high-speed operation mode to the processor chip 155 in the form of the fs-mode bit. In a communication awaiting state, an incoming-call decision, etc. may be performed at low speed by setting the low-speed operation mode to the processor chip 155 in the slmode bit. Upon such a low-speed operation, the leak current can be reduced as described above and the battery operating time can be extended. Further, power consumption can be reduced upon standby. It is therefore possible to increase the battery driving time.

Thus, if the MT-CMOS technology is further applied to the personal digital assistant, then a high-speed operation at the time that a low voltage source is used, can be assured. Besides, power consumption at standby and low-speed operation can be controlled. In the present embodiment, the functional blocks 8 and 152 respectively serve as CMOS circuits. The operating power supply is a low voltage like 1V. Further, the MOS transistors 12 and 14 for power supply respectively serve as high-threshold transistors. Since the transistors constituting the functional blocks 8 and 152 are low-threshold transistors, the effects of the conventional MT-CMOS can all be exhibited.

As the personal digital assistant according to the embodiment is compared with the simple MT-CMOS technology, the present embodiment can reduce the leak current developed when the transistors of the logic circuit block are turned off, upon the low-speed operation synchronized with the low-frequency clock signal not allowing for the MT-CMOS technology.

Even as compared with the VT-CMOS technology, the embodiment simply switch-controls the MOS transistors 12 and 14 for supplying power and does not require providing a comparatively large substrate or a frequently charge/discharge well capacitance. It is therefore possible to intermittently cut off a power supply while following or responding to a clock cycle.

The invention made by the present inventors as described above has been described specifically by the embodiments. However, the present invention is not limited to those. Various changes can be made thereto within the scope not departing from the substance thereof.

For example, the logic circuit block is not limited to the CMOS circuit, and the operating power supply is not limited to the low voltage like 1V and may be a voltage like 3.3V. The above relation between the threshold voltage for each power supply switch and the threshold voltage for each transistor constituting the logic circuit block is not limited to the case where the former is a large threshold voltage and the later is a low threshold voltage. The present invention can also be implemented as a circuit activated based on a low-speed operation alone, i.e., a circuit intermittently supplied with an operating power supply for each clock cycle. The standby mode is not an absolute necessity for the present invention. Further, the configurations of the functional blocks 8 and 12 are not limited to the above-described embodiments and may be suitably changed. For instance, the data processing equipment employed in the present invention may be configured as a single-chip or multichip microprocessor. In the case of the single chipconfigured microprocessor, a peripheral circuit may not be incorporated therein. For example, only the circuit configuration of the processor main circuit 160 may be constituted as a logic circuit block.

INDUSTRIAL APPLICABILITY

The present invention can widely be applied to a computer system such as a personal computer; a digital video camera, a digital still camera, etc., a data processor which is batter-driven, or reduced in power consumption and thereby becomes effective; and a data processing system as well as to portable information devices such as a cellular phone, a PDA, etc.

What is claimed is:

1. A semiconductor integrated circuit, comprising:
    a logic circuit block operatively connected to a clock signal source;
    at least one power supply switch operatively connected to supply power to said logic circuit block; and a switch control circuit for controlling said power supply switch, wherein
said clock signal source supplies a first clock signal and a second clock signal, said second clock signal having a cycle time that is longer than said first clock signal, and
said switch control circuit switch-controls said power supply switch so as to selectively engage said logic circuit block with one of said first and second clock signals so as to operate said logic circuit block in synchronism with-the first clock signal in a first operating mode and in synchronism with the second clock signal in a second operating mode.

2. The semiconductor integrated circuit as claimed in claim 1, wherein a threshold voltage of said power supply switch is greater than a threshold voltage of each of transistors which constitute said logic circuit block.

3. The semiconductor integrated circuit as claimed in claim 2, wherein said logic circuit block is a CMOS circuit.

4. The semiconductor integrated circuit as claimed in claim 2, wherein the threshold voltage of said power supply switch is set greater than the threshold voltage of each of the transistors which constitute said logic circuit block, by changing a substrate or well potential.

5. The semiconductor integrated circuit as claimed in claim 2, further including setting means for programnmably setting an on operation period of said power supply switch, and wherein said switch control circuit determines the on operation period, based on a set value supplied from said setting means.

6. The semiconductor integrated circuit as claimed in claim 2, wherein said switch control circuit effects the switch control on said power switch when a first operation mode is specified, and brings said power supply switch to an on state at all times when a second operation is specified.

7. The semiconductor integrated circuit as claimed in claim 2, further including a clock control circuit which is supplied with a first clock signal and a second clock signal higher than the first clock signal in frequency and which supplies the first clock signal to said logic circuit block when a first operation mode is specified, supplies the second clock signal to said logic circuit block when a second operation mode is specified, and stops the supply of the clock signals to said logic circuit block when a third operation mode is specified, and wherein said switch control circuit effects the switch control on said power supply switch when the first operation mode is specified, brings said power supply switch to an on state at all times when the second operation mode is specified, and turns on said power supply switch for each predetermined period when the third operation mode is specified, thereby refreshing an internal node in said logic circuit block.

8. The semiconductor integrated circuit as claimed in claim 2, wherein said power supply switch is one switch selected from a first switch connected to a power-supply terminal on the high-potential side and a second switch connected to a power-supply terminal on the low-potential side, or both switches thereof.

9. The semiconductor integrated circuit as claimed in claim 1, further including setting means for programmably setting an on operation period of said power supply switch, and wherein said switch control circuit determines the on operation period, based on a set value supplied from said setting means.

10. The semiconductor integrated circuit as claimed in claim 1, wherein said switch control circuit effects the switch control on said power switch when a first operation mode is specified, and brings said power supply switch to an on state at all times when a second operation is specified.

11. The semiconductor integrated circuit as claimed in claim 10, further including setting means for programmably setting an on operation period of said power supply switch subjected to the switch control, and wherein said switch control circuit determines the on operation period of said power supply switch in the first operation mode, based on a set value supplied from said setting means.

12. The semiconductor integrated circuit as claimed in claim 11, further including a clock control circuit which is supplied with a first clock signal and a second clock signal higher than the first clock signal in frequency and which supplies the first clock signal to said logic circuit block when the first operation mode is specified and supplies the second clock signal to said logic circuit block when the second operation mode is specified.

13. The semiconductor integrated circuit as claimed in claim 12, wherein said sequence circuit is operated in synchronism with a first edge of the clock signal.

14. The data processing system as claimed in claim 12, wherein said plurality of logic circuit blocks respectively constitute processors and said each processor includes a CPU subjected to clock control and power-supply control responsive to the high-speed, low-speed and standby modes, and an interrupt control circuit subjected to the clock control and power-supply control responsive to the highspeed and low-speed modes.

15. The semiconductor integrated circuit as claimed in claim 1, further including a clock control circuit which is supplied with a first clock signal and a second clock signal higher than the first clock signal in frequency and which supplies the first clock signal to said logic circuit block when a first operation mode is specified, supplies the second clock signal to said logic circuit block when a second operation mode is specified, and stops the supply of the clock signals to said logic circuit block when a third operation mode is specified, and wherein said switch control circuit effects the switch control on said power supply switch when the first operation mode is specified, brings said power supply switch to an on state at all times when the second operation mode is specified, and turns on said power supply switch for each predetermined period when the third operation mode is specified, thereby refreshing an internal node in said logic circuit block.

16. The semiconductor integrated circuit as claimed in claim 1, wherein said power supply switch is one switch selected from a first switch connected to a power-supply terminal on the high-potential side and a second switch connected to a power-supply terminal on the low-potential side, or both switches thereof.

17. A semiconductor integrated circuit as claimed in claim 1, wherein said switch control circuit further controls said power supply switch so as to clear said logic circuit block in said first operating mode, and to supply power to said logic circuit block for a period shorter than the cycle time of the second clock signal during the second operating mode.

18. A semiconductor integrated circuit, comprising:
a logic circuit block including a combinational circuit and a sequence circuit operatively connected to a clock signal source;
at least one transistor operatively connected to control the supplying of power from a power supply to the combinational circuit and the sequence circuit of said logic circuit block; and
a switch control circuit which controls said transistor, wherein said clock signal source includes a first clock signal and a second clock signal, said second clock signal having a cycle time that is longer than said first clock signal, and said switch control circuit switch-controls said transistor so as to selectively engage the combinational circuit and sequence circuit with one of said first and second clock signals so as to operate the combinational circuit and sequence circuit in synchronism with the first clock signal in a first operating mode and in synchronism with the second clock signal in a second operating mode.

19. The semiconductor integrated circuit as claimed in claim 18, wherein a threshold voltage of said transistor is greater than that of each of transistors which constitute said logic circuit block.

20. The semiconductor integrated circuit as claimed in claim 19, wherein the threshold voltage of said transistor is set greater than that of each transistor constituting said logic circuit block by changing a substrate or well potential.

21. The semiconductor integrated circuit as claimed in claim 20, wherein said transistor is a MOS transistor.

22. A semiconductor integrated circuit as claimed in claim 18, wherein said switch control circuit further controls said transistor so as to clear said logic circuit block in said first operating mode, and to supply power to said logic circuit block for a period shorter than the cycle time of the second clock signal during the second operating mode.

23. A semiconductor integrated circuit, comprising:

a logic circuit block including a combination circuit and a sequence circuit operatively connected to a clock signal source;

at least one MOS transistor operatively connected to control the supplying of power from a power supply to the combinational circuit and the sequence circuit of said logic circuit block;

a switch control circuit which controls said MOS transistor; and a control signal, wherein said clock signal source includes a first clock signal and a second clock signal, said second clock signal having a cycle time that is longer than said first clock signal, and said switch control circuit is operatively connected to receive the control signal and in response thereto switch-control said MOS transistor so as to selectively engage the combinational circuit and sequence circuit with one of said first and second clock signals and thereby operate the combinational circuit and sequence circuit in synchronism with the first clock signal in a first operating mode and in synchronism with the second clock signal in a second operating mode.

24. A semiconductor integrated circuit as claimed in claim 23, wherein said switch control circuit further controls said MOS transistor so as to clear said logic circuit block in said first operating mode, and to supply power to said logic circuit block for a period shorter than the cycle time of the second clock signal during the second operating mode.

* * * * *